United States Patent [19]

Fiat

[11] Patent Number: 5,433,196
[45] Date of Patent: Jul. 18, 1995

[54] OXYGEN-17 NMR SPECTROSCOPY AND IMAGING IN THE HUMAN

[75] Inventor: Daniel Fiat, Oak Park, Ill.

[73] Assignee: The Board of Trustees of the University of Illinois, Urbana, Ill.

[21] Appl. No.: 71,582

[22] Filed: Jun. 2, 1993

[51] Int. Cl.[6] .............................................. A61B 5/055
[52] U.S. Cl. ................................. 128/632; 128/653.2; 128/653.4
[58] Field of Search ................... 128/632, 653.2, 653.4, 128/654, 653.5; 324/318, 322, 309; 436/173

[56] References Cited

U.S. PATENT DOCUMENTS

| | | | |
|---|---|---|---|
| 3,764,892 | 10/1973 | Rollwitz | 324/0.5 R |
| 4,354,499 | 10/1982 | Damadian | 128/653 |
| 4,411,270 | 10/1983 | Damadian | 128/653 |
| 4,536,712 | 8/1985 | Iwaoka et al. | 324/309 |
| 4,558,279 | 12/1985 | Ackerman et al. | 324/315 |
| 4,586,511 | 5/1986 | Clark, Jr. | 128/653 |
| 4,651,097 | 3/1987 | Iwaoka et al. | 324/309 |
| 4,775,522 | 10/1988 | Clark, Jr. | 424/9 |
| 4,922,203 | 5/1990 | Sillerud et al. | 324/307 |
| 4,984,574 | 1/1991 | Goldberg et al. | 128/653 A |
| 4,996,041 | 2/1991 | Arai et al. | 424/9 |
| 5,339,814 | 8/1994 | Lasker | 128/653.4 |

OTHER PUBLICATIONS

Arai, et al., "Method for the Detection of Tissue Metabolite ($H_2{}^{17}O$) in Brain by Proton Magnetic Resonance Imaging," *Critical Care Medicine*, vol. 17, No. 12, pp. 1333–1334 (1989).
Barr, et al., "Constrast Enhancement with SSFP Techniques Applied to Oxygen 17 Based Contrast Agents".
Bratton, et al., "Nuclear Magnetic Resonance Studies of Living Muscle," *Science*, vol. 147, pp. 738–739 (Feb. 12, 1965).
Burstein, et al., "Magnetic Resonance Imaging of Intracellular Sodium," *Journal of Magnetic Resonance 83*, 197–204 (1989).
DeLayre, et al., "Gated Sodium-23 Nuclear Magnetic Resonance Images of an Isolated Perfused Working Rat Heart," *Science*, vol. 212, pp. 935–936 (May 22, 1981).
Fiat, et al., "Determination of the Rate of Cerebral Oxygen Consumption and Regional Cerebral Blood Flow by Non–Invasive $^{17}O$ In Vivo NMR Spectroscopy and Magnetic Resonance Imaging," Neurological Research, vol. 14, pp. 303–311 (Sep. 1992).
Fiat, et al., "Determination of the Rate of Cerebral Oxygen Consumption and Regional Cerebral Blood Flow by Non–Invasive $^{17}O$ In Vivo NMR Spectroscopy and Magnetic Resonance Imaging," Neurological Research, vol. 15, pp. 7–22 (Feb. 1993).
Fiat, et al., "Monitoring Cerebral Oxygen Consumption with In Vivo Imaging $^{17}O$ NMR," Presented at the (List continued on next page.)

*Primary Examiner*—Ruth S. Smith
*Attorney, Agent, or Firm*—Marshall, O'Toole, Gerstein, Murray & Borun

[57] ABSTRACT

An apparatus and method of imaging a human body portion of a living person via magnetic resonance of oxygen-17 constituents in the living person. In the method, a static magnetic field of a selected magnitude is generated around the living person, the selected magnitude not being substantially greater than 1.5 Tesla, and a resonant electromagnetic field of a selected frequency is generated around the human body portion. The frequency of the resonant electromagnetic field and the magnitude of the static magnetic field are selected to cause magnetic resonance of oxygen-17 constituents in the human body portion. Oxygen-17 NMR signals generated from the magnetic resonance of the oxygen-17 constituents are received, and an image of the human body portion is generated based upon the oxygen-17 NMR signals. The apparatus and method also include means for determining the quantitative rates of blood flow and oxygen consumption in the human body portion based on the inhalation by the living person of a gas containing an oxygen-17 concentration different than the natural abundance concentration of oxygen-17 in air.

29 Claims, 13 Drawing Sheets

OTHER PUBLICATIONS

XVth International Symposium on Cerebral Flow and Metabolism, Jun. 1–6, 1991, Miami, Florida.

Fiat, et al., "Monitoring Cerebral Oxygen Consumption In Vivo $^{17}$O NMR," *Journal of Cerebral Blood Flow and Metabolism*, vol. 11, Suppl. 2, p. S781 (1991).

Fiat, et al., "In Vivo $^{17}$O NMR Study of Rat Brain during $^{17}$O$_2$ Inhalation," *Magnetic Resonance in Medicine 24*, pp. 370–374, (Apr. 1992).

Fiat, et al., "$^{17}$O NMR and MRI Determination of Cerebral Metabolism of Oxygen (rCMRO$_2$) and Cerebral Blood Flow (rCBF)[1] in the Man" (1993).

Hall, et al., "Mapping of pH and Temperature Distribution Using Chemical-Shift-Resolved Tomography," *Journal of Magnetic Resonance 65*, pp. 501–505 (1985).

Hopkins, et al., "Improved Sensitivity of Proton MR to Oxygen-17 as a Contrast Agent Using Fast Imaging: Detection in Brain," *Magnetic Resonance in Medicine 7*, pp. 222–229 (1988).

Hopkins, et al., "Oxygen-17 Compounds as Potential NMR T$_2$ Contrast Agents: Enrichment Effects of H$_2$$^{17}$O on Protein Solutions and Living Tissues," *Magnetic Resonance in Medicine 4*, pp. 399–403 (1987).

Hopkins, et al., "Multiple Field Strength In Vivo T$_1$ and T$_2$ for Cerebrospinal Fluid Protons," *Magnetic Resonance in Medicine 3*, pp. 303–311 (1986).

Hopkins, et al., "On the Monitoring of Proton Exchange Rates of Living Tissue In *Situ*," Proceedings of the *AMPERE Conference on Hertzian Optics and Dielectrics—Sep. 2–4, 1987, Pisa, Italy.*

Hopkins, et al., "Physiological Application of $^{17}$O Promoted Proton T$_2$ Relaxation[a]," *Annals New York Academy of Sciences*, pp. 463–465.

Hsieh, et al., "$^{31}$P Imaging of in Vivo Creatine Kinase Reaction Rates," *Journal of Magnetic Resonance 74*, pp. 574–579 (1987).

Joseph, et al., "In Vivo $^{19}$F NMR Imaging of the Cardiovascular System," *Journal of Computer Assisted Tomography*, vol. 9, No. 6, pp. 1012–1019 (1985).

Kety, "The Theory and Applications of the Exchange of Inert Gas at the lungs and Tissues," *Pharmacological Reviews*, vol. 3, pp. 1–41 (1951).

Kwong, et al., "Quantitative Single-Shot Imaging with H$_2$ of the Effect of pco$_2$ on Regional Cerebral Blood Flow with H$_2$$^{17}$O," *JMRI*, p. 192 (Mar./Apr. 1991).

Lasker, et al., "Proton NMR Imaging of Myocardial Reperfusion Injury by Visualization of Metabolites of Oxygen-17," *Ninth Annual Scientific Meeting and Exhibition*, p. 1202 (Aug. 18–24, 1990).

Link, et al., "Comparison of Deuterium NMR Imaging Methods and Applications to Plants," *Journal of Magnetic Resonance 89*, pp. 310–330, (1990).

McFarland, et al., "Chemical Exchange Magnetic Resonance Imaging (Chemi)," *Magnetic Resonance Imaging*, vol. 6, pp. 507–515 (1988).

Mateescu, et al., "The Hydronium Ion (H$_3$O$^{30}$). Preparation and Characterization by High Resolution Oxygen-17 Nuclear Magnetic Resonance," *Journal of the American Chemical Society*, 101:14, 3959–3960, (Jul. 4, 1979).

Mateescu, et al., "Water, Ions and O-17 Magnetic Resonance Imaging," *Water and Ions in Biological Systems*, pp. 239–250 (1988).

Mateescu, et al., "Oxygen-17 MRS: In Vivo Evaluation of Water Uptake and Residence Time in the Mouse Brain after Injection of O-17 Labelled Water," p. 1236 (1990).

Mateescu, et al., "Oxygen-17 MRI and MRS of the Brain, the Heart and Coronary Arteries," (1989).

Mateescu, et al., "Oxygen-17: A Physiological, Biochemical and Anatomical MRI Contrast Agent," *Society of Magnetic Resonance in Medicine*, p. 600 (1988).

Mateescu, et al., "In Vivo Determination of Oxygen Utilization by Localized $^{17}$O Magnetic Resonance Spectroscopy: Detection of Metabolic Water In Mice Breathing $^{17}$O-Enriched Air," (1991).

Mateescu, et al., "Oxygen-17 Magnetic Resonance Imaging[1]," p. 929 (1987).

Mateescu, et al., "Oxygen-17 Magnetic Resonance: In Vivo Detection of Nascent Mitochondrial Water in Animals Breathing $^{17}$O$_2$ Enriched Air," Society of Magnetic Resonance in Medicine (1991).

Mateescu, et al., "Combined $^{17}$O/$^1$H Magnetic Resonance Microscopy in Plants, Animals and Materials: Present Status and Potential," *Synthesis and Applications of Isotopically Labelled Compounds*, pp. 499–508 (1988).

Maudsley, et al., "Spatially Resolved High Resolution Spectroscopy by 'Four-Dimensional' NMR," *Journal of Magnetic Resonance 51*, pp. 147–152 (1983).

Nunnally, et al., "Flourine-19 NMR Spectroscopy and Imaging Investigations of Myocardial Perfusion and (List continued on next page.)

OTHER PUBLICATIONS

Cardiac Function," *Magnetic Resonance Imaging*, vol. 3, pp. 399–405, (1985).

Pekar, et al., "*In Vivo* Measurement of Cerebral Oxygen Consumption and Blood Flow Using $^{17}O$ Magnetic Resonance Imaging," *Magnetic Resonance in Medicine 21, pp. 313–319 (1991)*.

Renshaw, et al., "*In Vivo* Nuclear Magnetic Resonance Imaging of Lithium," *Magnetic Resonance in Medicine 2*, pp. 512–516 (1985).

Renshaw, et al., "Relaxation and Imaging of Lithium in Vivo," *Magnetic Resonance Imaging*, vol. 4, pp. 193–198 (1986).

Schnall, et al., "A New Double-Tuned Probe for Concurrent $^{1}H$ and $^{31}P$ NMR," *Journal of Magnetic Resonance 65*, pp. 122–129 (1985).

Thomas, et al., "MR Imaging of the Lung Using Liquid Perfluorocarbons," *Journal of Computer Assisted Tomography*, vol. 10, No. 1, pp. 1–9 (1986).

Young, "Magnetic Resonance Imaging: Basic Principles", Second Edition, pp. XV and 1–243 (1984).

*Signa System Operator Manual*, OMS2, Rev. 12, Table of Contents and pp. 6–1—6B–27, published prior to Jun. 1992.

OXYGEN-17 NMR SPECTROSCOPY AND IMAGING IN THE HUMAN

BACKGROUND OF THE INVENTION

The present invention relates to oxygen-17 nuclear magnetic resonance spectroscopy and imaging apparatus and methods in the living human, including the determination of blood flow and oxygen metabolism rates.

Various isotopes have been considered for use in connection with nuclear magnetic resonance (NMR) spectroscopy and imaging systems, which are in widespread use. Most NMR systems in use today are based on the hydrogen-1 isotope because that isotope can be easily detected in humans for a number of reasons, including the fact that hydrogen-1 has a relatively large nuclear magnetic moment and the fact that its concentration in humans is relatively large. Those two factors allow conventional NMR systems to generate NMR signals having a relatively large signal-to-noise (S/N) ratio. The S/N ratio is a measure of how easily an isotope can be detected in NMR.

Other isotopes have been considered for use in NMR. Research has been conducted in connection with oxygen-17 NMR, mainly in connection with small laboratory animals. It has been generally acknowledged that oxygen-17 NMR spectroscopy and imaging are difficult for a number of reasons. First, oxygen-17 has a relatively weak magnetic moment, which is approximately 7.4 times weaker than the magnetic moment of hydrogen-1, which is commonly imaged by conventional NMR systems. Hydrogen-1 imaging is commonly referred to as "proton" imaging. The weaker magnetic moment of oxygen-17 results in a smaller S/N ratio than that which can be accomplished with hydrogen-1.

Another obstacle to oxygen-17 NMR is the very low concentration, or natural abundance, of oxygen-17, which fact further reduces the S/N ratio which could be achieved in oxygen-17 NMR. The natural abundance of the oxygen-17 isotope in air is only 0.037%. Due to inhalation of air containing oxygen-17, the natural abundance of oxygen-17 in the water of tissues in animals and humans is also 0.037%.

These obstacles to oxygen-17 NMR have been recognized by those working in the field. For example, in U.S. Pat. No. 4,984,574 issued in 1991, Goldberg, et al. state: "It might, accordingly, be thought that existing NMR methods could be applied to measure the oxygen content of living human fetuses. Such a direct application, however, seems infeasible for reasons including the following: First, naturally occurring oxygen consists mainly of $^{16}O$, whose nucleus possesses no magnetic moment (hence has gyromagnetic ratio zero) and so cannot be studied by NMR. The natural abundance of $^{17}O$, which does possess a magnetic moment, is only 0.37% (sic, 0.037%) and its intrinsic sensitivity is approximately $1.08 \times 10^{-5}$ times that of $^1H$. As a result, the NMR signal from oxygen within a natural sample or living creature is only some four billionths as strong as the signal from an equal concentration of hydrogen nuclei within it, effectively ruling out any chance of detection by available methods."

Instead of utilizing oxygen-17 NMR, oxygen-17 has been used as a contrast agent in hydrogen-1 NMR. For example, in *Oxygen-17 Compounds as Potential NMR $T_2$ Contrast Agents: Enrichment Effects of $H_2{}^{17}O$ on Protein Solutions and Living Tissues*, published in 1987, Hopkins, et al. disclose that the isotopic enrichment of solutions, living tissues, and organisms with oxygen-17 in the form of $H_2{}^{17}O$ shortens their proton (hydrogen-1) NMR transverse relaxation times ($T_2$) and suggest that oxygen-17 would therefore be useful as a contrast agent. In particular, Hopkins, et al. state: "Since changes in proton $T_2$ can alter image intensity, localized variation in $H_2{}^{17}O$ concentrations could be directly visualized as well as monitored in samples with the usual proton equipment and $T_2$ procedures."

Oxygen-17 NMR research has been performed by Professor Gheorghe D. Mateescu and others at the Case Western Reserve University in Ohio. In an abstract entitled *Oxygen-17 Magnetic Resonance Imaging* from the Sixth Annual Meeting of the Society of Magnetic Resonance in Medicine in 1987, Mateescu, et al. acknowledged the difficulties in oxygen-17 imaging: "Water is the primary signal source in Magnetic Resonance Imaging. So far, proton detection has been exclusively used because of its high sensitivity, while the O-17 nucleus has generally been considered impractical for MRI, owing to its 'unfavorable' properties: very low natural abundance, low detection sensitivity, and considerable quadrupolar broadening." The authors went on to state that some of the "drawbacks" of oxygen-17 imaging could be turned into "advantages" and further stated: "The O-17 projection reconstruction of a T-shaped phantom shown in FIG. 1 compares favorably with the proton image of a similar phantom described in a review by Andrew.[3] Although 1000 times less sensitive, the O-17 measurement in natural abundance takes only ~10 times longer than the proton measurement. This is clue to its much faster (quadrupolar) relaxation time which allows many more scans per unit time."

In *Combined $^{17}O/^1H$ Magnetic Resonance Microscopy in Plants, Animals and Materials: Present Status and Potential* published in 1989, Mateescu, et al., in a section entitled "Basic Principles of Magnetic Resonance Imaging," state: "Since the measurement is always made some time after pulse excitation and, in order to build sufficient signal-to-noise it is necessary to accumulate the signals of repetitive scans, the image intensity depends on both the $T_2$ and $T_1$ properties of the specimen. This makes it possible to obtain $T_1$ or $T_2$ weighted images by selecting an imaging sequence with appropriately ordered and timed rf and gradient pulses." In connection with the magnetic resonance properties of oxygen-17, Mateescu, et al. stated that the fast quadrupolar relaxation time of oxygen-17 allows pulsing rates at least 20 times faster without signal loss.

In an abstract entitled *Oxygen-17 MRI and MRS of the Brain, the Heart and Coronary Arteries* from the Eighth Annual Meeting of the Society of Magnetic Resonance in Medicine in 1989, Mateescu, et al. illustrated in vitro oxygen-17 images of a human heart and coronary arteries. The images were of an excised human heart into which 20% oxygen-17 water was injected after ligation of the three ends of the coronary segment.

It has been suggested that oxygen-17 NMR spectroscopy and imaging might be used in humans. In *In Vivo Measurement of Cerebral Oxygen Consumption and Blood Flow Using $^{17}O$ Magnetic Resonance Imaging*, published in 1991 by Pekar, et al., the authors, who include the inventor of the present invention, state that "In summary, $^{17}O$ NMR techniques have been used to measure cerebral blood flow and oxygen consumption in a 0.8-ml voxel in the cat brain. The technique has the potential to image cerebral blood flow and oxygen consumption in humans."

Despite the above suggestions that oxygen-17 imaging might be successfully employed in humans, to the inventor's knowledge there has not been any report of successful oxygen-17 imaging in living human beings. Although the above abstracts and papers suggest imaging could be accomplished in humans, the actual experiments were generally carried out with laboratory animals or inanimate objects, e.g. an excised in vitro human heart. The use of laboratory animals allows relatively large magnetic fields, e.g. 9.4 Tesla device in the 1989 abstract of Mateescu, et al. referenced above, which are unsuitable for use on living human beings. The maximum magnetic field approved for use with living humans by the U.S. Food and Drug Administration is 2 Tesla. The use of a larger magnetic field for laboratory animals and inanimate objects results in a larger S/N ratio which allows images to be generated more easily.

Also, many of the oxygen-17 images reported above were generated based on the injection of relatively large amounts of oxygen-17 enriched water, the result of which increased the oxygen-17 concentration greatly above the 0.037 % natural abundance level. Although high-concentration oxygen-17 injections increase the S/N ratio, such invasive methods of increasing the oxygen-17 concentration (which often resulted in the death of the laboratory animals) are inappropriate for use in living humans.

A prior art NMR imager which has been in widespread use for more than a year is the Signa 1.5 Tesla imager commercially available from General Electric. The GE imager has a superconducting magnet for generating a static magnetic field of 1.5 Tesla. The imager has various modes of operation including, for example, a multi-planar, gradient recalled (MPGR) mode.

In the MPGR mode, a resonant magnetic field and gradient magnetic fields are generated. The resonant magnetic field, which induces resonance of hydrogen-1 constituents, is generated via a number of Hermitian pulses transmitted at a repetition rate TR. Although the RF frequency of the Hermitian pulses is variable between upper and lower limits as selected by the operator, the GE imager is typically used to cause magnetic resonance of hydrogen-1 constituents. Because the lower frequency limit is too high, the GE imager is incapable of generating a Larmor frequency that would cause magnetic resonance of oxygen-17 constituents.

In the GE imager, the gradient magnetic fields are generated by a number of $G_x$, $G_y$, $G_z$ pulses. The spacing of the $G_x$ pulse with respect to the Hermitian pulse is determined by an echo time TE. In the GE imager, both the echo time TE and the repetition time TR are selectable by the user within limits. The lower and upper limits for TE are 9 and 600 milliseconds (ms), respectively, and the upper and lower limits for TR are 34 and 6,000 ms, respectively. The GE imager also performs sample averaging of a plurality of hydrogen-1 NMR signals for a particular area of a human body. The number of samples which are averaged, which is referred m as "NEX, " is selectable by the operator of the imager.

The GE imager is incapable of generating oxygen-17 images for at least the following reasons. The GE imager is incapable of transmitting an RF signal at a Larmor frequency for oxygen-17 constituents; the lower limits of the TE and TR times are too high to facilitate the generation of oxygen-17 images; and the hardware of the GE imager does not provide sufficient low-noise amplification of the NMR signals to facilitate the generation of oxygen-17 images.

The accurate determination of the oxygen metabolism rate in various portions of a live human being is important for numerous clinical applications. For example, the cerebral oxygen metabolism rate is important for clinical applications include assessing dementia, treating brain tumors, detecting cerebral ischemia (oxygen-deficiency), and understanding neurobehavioral disorders. The oxygen metabolism rates in other organs, such as the heart or lungs, is important for other clinical applications.

One conventional manner of determining the rate of oxygen consumption in a live human being is positron emission tomography (PET). Such systems operate by detecting radioactive oxygen isotopes, such as oxygen-15. PET systems have a number of significant disadvantages. Because PET systems rely on radioactive isotopes, they require cyclotrons, which are expensive and difficult to operate. Because the half-life of the radioactive isotope is typically short, e.g. 124 seconds of oxygen-15, the cyclotron must be situated relatively near the PET system and provide an on-line supply of oxygen-15. As a result, PET systems are typically very expensive, on the order of $7 million. The cost of a single PET determination is also expensive, being on the order of $10,000. A further disadvantage of the use of radioactive isotopes by PET systems is that PET determinations are usually not repeated more than two to three times in adults and are rarely used for children and infants. PET systems also require catheterization.

Another significant disadvantage is the methodology on which PET systems are based. The consumption of oxygen results from metabolism of glucose in accordance with the following equation:

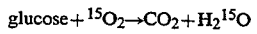

$$\text{glucose} + {}^{15}O_2 \rightarrow CO_2 + H_2{}^{15}O$$

The fact that radioactive oxygen-15 is present in both the substrate ($^{15}O$ labelled oxyhemoglobin) and the oxygen-15 water product, and the fact that the PET system detects both the radioactive oxyhemoglobin and radioactive oxygen-15 water, make it difficult to distinguish between the oxyhemoglobin substrate and the water product as well as the reflow of oxygen-15 water and complicates and introduces errors in the calculation of the oxygen consumption rate. Although the PET system utilizes semi-empirical equations to overcome that difficulty, the use of such equations casts doubt on the accuracy of the PET method to determine the rate of oxygen consumption. For example, it has been found that upon light stimulation, the metabolism of glucose in an area of tissue increased while the rate of oxygen consumption in the tissue area decreased, which result is doubtful since glucose metabolism and oxygen consumption are directly, not inversely, related.

Mateescu, et al. have done NMR research in connection with inhalation of oxygen-17 by animals. In an abstract entitled *Oxygen-17 Magnetic Resonance: In vivo Detection of Nascent Mitochondria Water in Animals Breathing $^{17}O_2$ Enriched Air* from the 10th Annual Meeting of the Society of Magnetic Resonance in Medicine, Mateescu, et al. tracked the quantity of $H_2{}^{17}O$ in the head of a mouse. Mateescu, et al. stated that: "Our results show that good quantitation can be obtained from volumes smaller than 1 cm$^3$. This indicates that a good resolution should be obtained with larger animals and humans."

In the above abstract, although Mateescu, et al. disclose tracking the amount of $H_2{}^{17}O$ in the mouse head, they did not determine the true rate of oxygen consumption or the rate of blood flow in the mouse head because they failed to account for the appearance of $H_2{}^{17}O$ due to reflow effects resulting from the recirculation of $H_2{}^{17}O$-enriched blood. It has been recognized that the amount of $H_2{}^{17}O$ present in a portion of tissue is due to two components: 1) the production of $H_2{}^{17}O$ in the tissue due to metabolism; and 2) the change in $H_2{}^{17}O$ in the tissue due to $H_2{}^{17}O$-enriched blood flow into and out of the tissue. Thus, Mateescu, et al. failed to account for the second component above.

That the amount of $H_2{}^{17}O$ present in a portion of tissue is due to the above two components is described in *In Vivo Measurement of Cerebral Oxygen Consumption and Blood Flow Using $^{17}O$ Magnetic Resonance Imaging*, published in 1991 by Pekar, et al., including the inventor. That paper describes a method of in vivo measurement of the rate of cerebral oxygen consumption and blood flow in a cat via oxygen-17 NMR via bolus injections of oxygen-17 enriched water and inhalation of oxygen-17 enriched air. The increase of $H_2{}^{17}O$ in the cat brain due to reflow and the increase of $H_2{}^{17}O$ due to metabolism are shown in the graph of FIG. 3 of the paper.

There are several other methods used for the determination of localized blood flow, such as the magnitude of blood flow in the brain. One widely used method of determining the rate of localized blood flow in the human is the single photon emission computed tomography (SPECT) system. However, SPECT systems have a number of significant disadvantages in that they use radioactive isotopes and they do not generate quantitative data regarding blood flow, but only generate data indicative of the relative rate of blood flow in different portions of the body.

SUMMARY OF THE INVENTION

The present invention is directed to an apparatus for performing a method of generating oxygen-17 images of a body portion of a living person via magnetic resonance of oxygen-17 constituents. The method includes the steps of generating a static magnetic field of a selected magnitude around the person, the selected magnitude not being substantially greater than 3 Tesla, and generating a resonant electromagnetic field of a selected frequency around the body portion. The frequency of the resonant electromagnetic field and the magnitude of the static magnetic field are selected to cause magnetic resonance of oxygen-17 constituents in the body portion. The method also includes the steps of receiving oxygen-17 NMR signals generated from the magnetic resonance of the oxygen-17 constituents and generating an image of the body portion based upon the oxygen-17 NMR signals.

The above method is capable of generating an oxygen-17 image even where the concentration of oxygen-17 constituents in the body portion is smaller than about 100 times the natural abundance of oxygen-17 in the body portion, and is even capable of generating oxygen-17 images at the natural abundance level of oxygen-17 in the body potion.

In the method of imaging, electromagnetic field gradients having a magnitude not substantially greater than five gauss per centimeter may be generated around the person. Oxygen-17 images may be generated where the magnitude of the electromagnetic field gradients does not exceed one gauss per centimeter. Higher field gradients result in higher resolution.

Averaging of a plurality of oxygen-17 NMR signals may be utilized to increase the S/N ratio. The resonant electromagnetic field may be generated by transmitting a plurality of RF pulses spaced apart by a repetition time TR less than 34 milliseconds to facilitate averaging of a relatively large number of NMR signals. The electromagnetic field gradients may be generated via a plurality of pulses having an echo delay time TE less than nine milliseconds to facilitate NMR signal averaging.

The apparatus of the invention also performs a method of determining the quantitative rate of blood flow in a body portion of a living person based upon oxygen-17 NMR signals generated while the person inhales a gas containing a concentration of oxygen-17 different from the natural abundance of oxygen-17 in air. Preferably, the concentration of oxygen-17 in the inhaled gas is substantially greater than the natural abundance concentration, such as at least 10% oxygen-17. The method includes the steps of generating a static magnetic field of a selected magnitude around the person and generating a resonant electromagnetic field of a selected frequency around the body portion. The frequency of the resonant electromagnetic field and the magnitude of the static magnetic field are selected to cause magnetic resonance of $H_2{}^{17}O$ in the body portion. The method also includes the steps of receiving oxygen-17 NMR signals generated from the magnetic resonance of $H_2{}^{17}O$ in the body portion during inhalation by the person of the oxygen-17 enriched gas and, based on the oxygen-17 NMR signals, generating a blood flow signal representative of the quantitative rate of blood flow through the body portion.

The method of determining blood flow, which is advantageously noninvasive, may determine the magnitude of organ tissue blood flow based on the difference between NMR signals generated during inhalation of the oxygen-17 enriched gas and an NMR signal generated prior to inhalation of the oxygen-17 enriched gas. The method of determining blood flow may be repeated several times, in which case the blood flow magnitude is based on the difference between the NMR signals before and after each period of enriched oxygen-17 inhalation.

The blood flow signal may be determined based upon the coefficients of an approximation curve, such as a least squares fit curve, of the NMR signals generated during inhalation. The approximation curve may be defined by a polynomial or an exponential function. The blood flow signal may be determined based upon the concentration $C_b$ of $H_2{}^{17}O$ in the body portion and an arterial concentration $C_a$ of $H_2{}^{17}O$, such as that of the aorta.

The apparatus of the invention also performs a method of determining the quantitative rate of metabolic oxygen consumption in a body portion of a living person based upon oxygen-17 NMR signals generated while the person inhales oxygen-17 enriched gas. The method includes the steps of generating a static magnetic field of a selected magnitude around the living person and generating a resonant electromagnetic field of a selected frequency around the body portion. The frequency of the resonant electromagnetic field and the magnitude of the static magnetic field are selected to cause magnetic resonance of $H_2{}^{17}O$ in the body portion.

The method also includes the steps of receiving oxygen-17 NMR signals generated from the magnetic resonance of $H_2{}^{17}O$ in the body portion during inhalation by the person of oxygen-17 enriched gas and, based on the oxygen-17 NMR signals, generating an oxygen consumption signal representative of the quantitative rate of metabolic oxygen consumption in the body portion.

The method of determining metabolic oxygen consumption, which is advantageously noninvasive, may determine the magnitude of oxygen consumption based on the difference between NMR signals generated during inhalation of the oxygen-17 enriched gas and an NMR signal generated prior to inhalation of the oxygen-17 enriched gas. The oxygen consumption signal may be determined based upon the coefficients of an approximation curve, such as a least squares fit curve, of the NMR signals generated during inhalation. The approximation curve may be defined by a polynomial or an exponential function. The oxygen consumption signal may be determined based upon the concentration $C_b$ of $H_2{}^{17}O$ in the body portion and an arterial concentration $C_a$ of $H_2{}^{17}O$, such as that of the aorta.

The parameters to be determined by the present invention can be determined by either localized magnetic resonance spectroscopy (localized MRS) or magnetic resonance imaging. Variation in time of oxygen-17 localized MRS or MRI pixel intensity during inhalation of natural air measures variations in regional oxygen metabolism rate and oxygen tissue blood flow due to physiological, neurological and psychiatric metabolic and circulatory effects on the regional rate of blood flow and oxygen consumption.

These and other features and advantages of the present invention will be apparent to those of ordinary skill in the art in view of the detailed description of the preferred embodiment, which is made with reference to the drawings, a brief description of which is provided below.

DETAILED DESCRIPTION OF A PREFERRED EMBODIMENT

Figure 1:
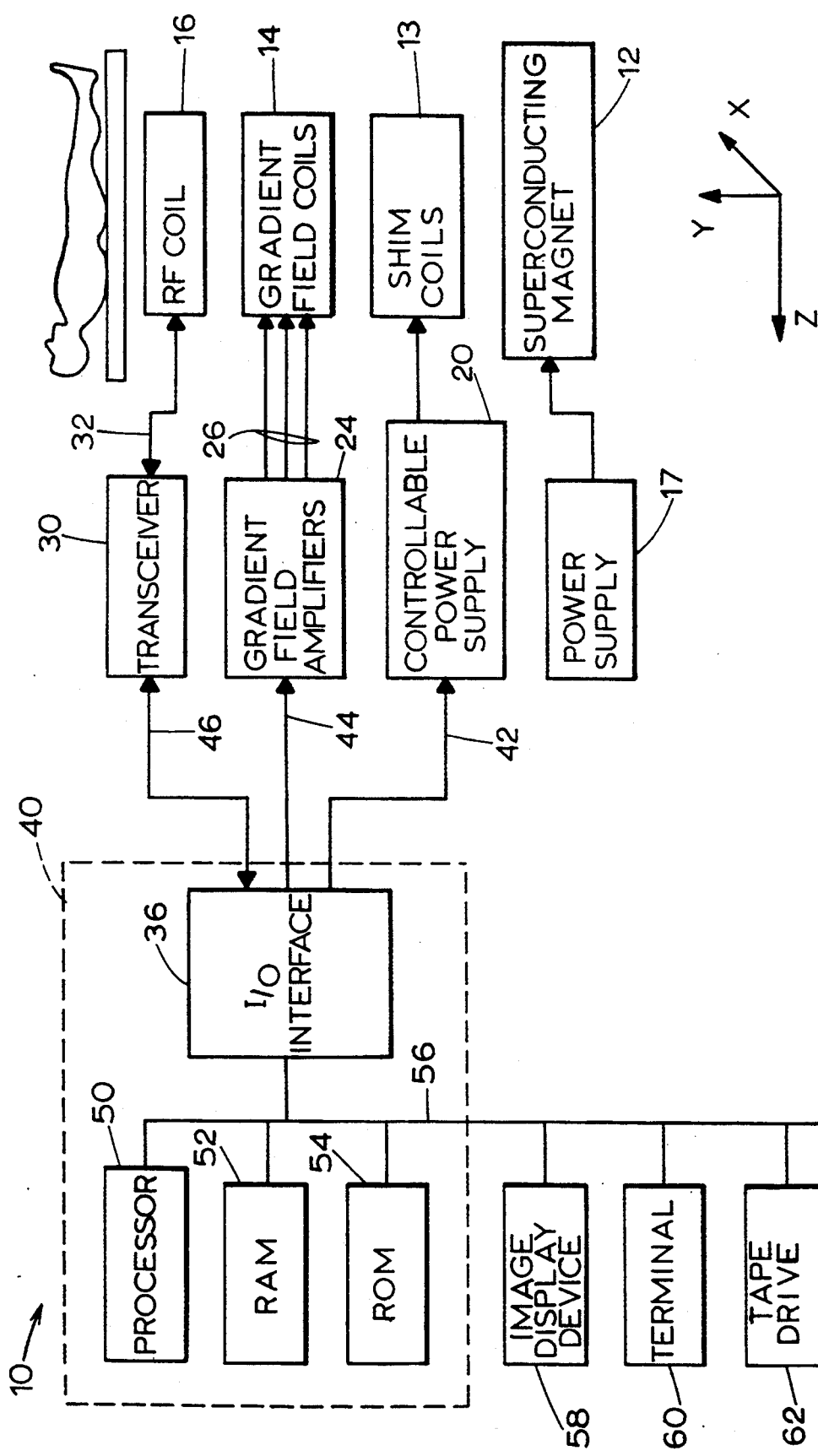
FIG. 1 illustrates an embodiment of an NMR spectroscopy and imaging system for use in connection with humans.

FIG. 1 illustrates a nuclear magnetic resonance (NMR) spectroscopy and imaging system 10 which operates by magnetically resonating oxygen-17 constituents in the body portion of a living human being. The NMR system 10 includes a plurality of elements for generating various magnetic fields to produce the magnetic resonance of the oxygen-17 constituents. These elements include a whole body, superconducting magnet 12 for generating a uniform, static magnetic field. The magnet 12 is referred to as a "whole body" magnet since its circumference is large enough to accommodate the entire body of a person. The uniform static magnetic field is generated in the z-direction as shown in FIG. 1. Like most standard NMR systems currently in operation in the United States, the superconducting magnet 12 generates a static magnetic field having a magnitude of 1.5 Tesla. While the magnet 12 is illustrated as a box 12 below the patient, it should be understood that the magnet 12 is generally cylindrical in shape and surrounds the patient. As is conventional, a number of shim coils 13 provide additional static fields to supplement the main static field generated by the magnet 12.

The NMR system 10 includes a number of whole body, gradient field coils 14 which generate magnetic field gradients in the x, y, z directions in a conventional manner to facilitate NMR spectroscopy and imaging. In conventional 1.5 Tesla NMR systems, the magnetic field gradients are typically between about 0.5–1.0 gauss/centimeter. The magnitude of the gradients is limited by FDA regulations. The gradient field coils 14 also surround the patient.

The NMR system 10 also includes an RF coil 16 for generating a resonant electromagnetic field at one or two radio frequencies for causing magnetic resonance of oxygen-17 constituents in the human patient. The resonant electromagnetic field may be generated in any direction perpendicular to the static field. For example, if the static magnetic field is generated in the z-direction, the resonant field may be generated in any direction in the x-y plane. The RF coil 16 also receives electrical NMR signals caused by the magnetic resonance of oxygen-17. While the RF coil 16 is shown schematically as a box 16 below the patient, it should be understood that the RF coil may surround the patient, or alternatively, local RF coils for generating localized magnetic fields could be utilized, such as an RF coil for the head of the patient.

A power supply 17 supplies power to the magnet 12; the static fields generated by the shim coils 13 are controlled via a controllable power supply 20; a number of gradient field amplifiers 24 controls the fields generated by the gradient field coils 14 via three lines 26, one line for each of the x, y, z directions; and a transceiver 30 controls the field generated by the RF coil 16 via a bidirectional line 32.

The elements 20, 24, 30 are connected to a conventional I/O interface 36 of a controller 40 via lines 42, 44, 46, respectively. The controller 40 also includes a processor 50, a random-access memory (RAM) 52, and a read-only memory (ROM) 54, all of which are interconnected via a data bus 56. An image display device 58, such as a cathode ray tube (CRT), is also connected to the controller 40. Additional components, such as a boot and editing terminal 60, a tape drive 62 for storing data relating to images, and a satellite station 64 for performing spectroscopy may also be connected to the controller 40.

During operation, the NMR system 10 generates a uniform static magnetic field via the superconducting magnet 12 and shim coils 13 and selectively generates the gradient and resonating magnetic fields via the coils 14, 16 so as to generate oxygen-17 NMR signals corresponding to a selected vertical slice in the x-y plane of the human subject.

Figure 2:
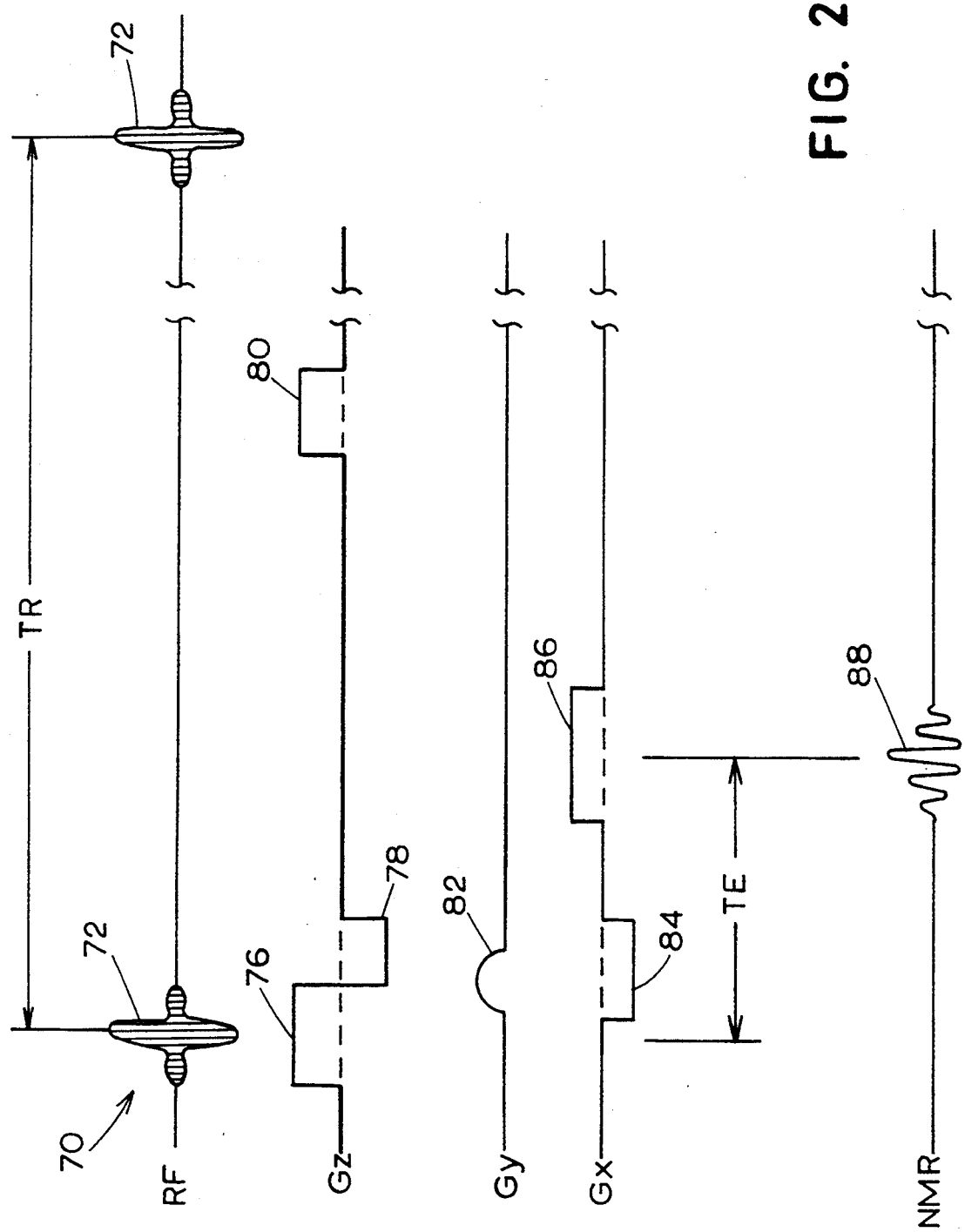
FIG. 2 illustrates a number of electrical signals generated during the operation of the NMR system of FIG. 1.

FIG. 2 illustrates one mode of NMR operation referred to as a multi-planar gradient recalled (MPGR) mode during which oxygen-17 images are generated. In general, the MPGR mode of operation for generating hydrogen-1 images is conventional and is utilized in commercially available imagers such as the Signa 1.5 Tesla model commercially available from General Electric (hereinafter referred to as the "GE Signa").

Referring to FIG. 2, to cause magnetic resonance of oxygen-17 constituents, an RF signal is generated by the transmitter portion of the transceiver 30, $G_x$, $G_y$, $G_z$ signals are generated by the gradient field amplifiers 24 via the three lines 26, and an NMR signal representing the magnitude of the oxygen-17 magnetic resonance is detected by the receiver portion of the transceiver 30.

The RF signal consists of a Hermitian pulse 70 with a magnitude envelope 72 having a central peak and a smaller peak on either side of the central peak. The central peak has a peak-to-peak magnitude of 140 millivolts (mv), and the width of the central peak is 1.5 milliseconds (ms). The peak-to-peak magnitude of each smaller peak is 12 mv, and the width of each smaller peak is 0.85 ms. The RF frequency of the Hermitian pulse, represented by the oscillating lines inside the magnitude envelope 72, is based upon the Larmor equation set forth below:

$$f = H\gamma/2\pi$$

where H is the magnitude of the static magnetic field, where $\gamma$ is the gyromagnetic ratio of the isotope to be magnetically resonated, and where f is the RF frequency necessary to cause nuclear magnetic resonance. To electromagnetically resonate oxygen-17 in a static magnetic field of 1.5 Tesla, the RF frequency necessary is 8.66 MHz.

As is conventional, the $G_z$ signal has a positive slice-select pulse 76 which selects for magnetic resonance a particular x-y slice perpendicular to the z-axis, a negative re-phase pulse 78, and a positive killer pulse 80. The $G_y$ signal has a positive pulse 82 which selects a particular y "line" in the x-y space to be magnetically resonated. The $G_x$ signal has a negative de-phase pulse 84 which, as is known, causes de-phasing of the precessing oxygen-17 constituents and a positive readout pulse 86. An NMR signal 88 is generated during the readout pulses of the $G_x$ signal.

Generating the above sequence of pulses will generate NMR signals corresponding to one linear portion of an x-y plane. To get NMR signals for the entire x-y plane, the above sequence of signals is repeated a number of times using $G_y$ pulses having different magnitudes. The signals other than the $G_y$ signal remain the same.

After an entire x, y plane is scanned, that same plane may be rescanned a number of times in order to generate plural sets of NMR signals. The plural sets of NMR signals may be averaged, the result of which affects the magnitude of the S/N ratio of the NMR signals. When a relatively large number of samples are averaged, the S/N ratio increases due to the cancellation of noise in the NMR signal.

An important factor in facilitating the generation of oxygen-17 images is the timing at which the above pulses are generated and the rate at which the entire pulse sequence is repeated. The echo time, designated TE in FIG. 2, is the time between the central peak of the Hermitian pulse and the NMR signal 88. The repetition time, designated TR in FIG. 2, is the time between successive Hermitian pulses 70.

The oxygen-17 nucleus possesses a nuclear electric quadrupole moment. Consequently, the nuclear magnetic resonance signal decays within about two milliseconds. An echo time TE of nine milliseconds is therefore too long to obtain an image in the MPGR mode. An image may be obtained with an echo time TE of six ms or less or by using the projection reconstruction method instead of the MPGR method. In the projection reconstruction method, the echo time TE is essentially zero since the acquisition is of the NMR signal itself and not of the echo.

The repetition time TR and the echo time TE are important because they affect the number of NMR signals which can be practically averaged. For example, assume that it would take the average of 50 samples of NMR data to generate a S/N ratio strong enough to generate images of sufficient clarity. If the TE and TR times are too long, it may take an unduly long period of time to obtain the NMR signals for 50 samples. Waiting such a long time has disadvantages. For example, during that time a non-sedated patient might move, thus adversely affecting the integrity of the NMR data generated. However, when very short TE and TR times are utilized, the overall time necessary to generate a sufficient number of NMR data samples is shortened, and the likelihood that the patient will move is decreased. In successfully obtaining oxygen-17 images of the human body, an echo time TE of 6 ms was used, and a repetition time TR of 20 ms was used. Even shorter TE and TR times would be desirable.

Conventional NMR imagers have numerous other modes of operation in addition to the MPGR mode described above. For example, in another mode of operation, instead of generating a Hermitian signal, the transmitter portion of the transceiver 30 first transmits a 90° pulse and subsequently transmits a 180° pulse. Since that mode is also characterized by the TE and TR times, it could be modified in accordance with the present invention to generate oxygen-17 images. As is known, the modes of operation described above rely on the production of an echo of the free induction decay (FID) signal to generate the NMR signals. Another conventional mode of operation, referred to as projection reconstruction, generates NMR signals directly from the FID signal itself, without the production of an echo. The present invention could also be used in connection with that method of operation.

Figure 3:
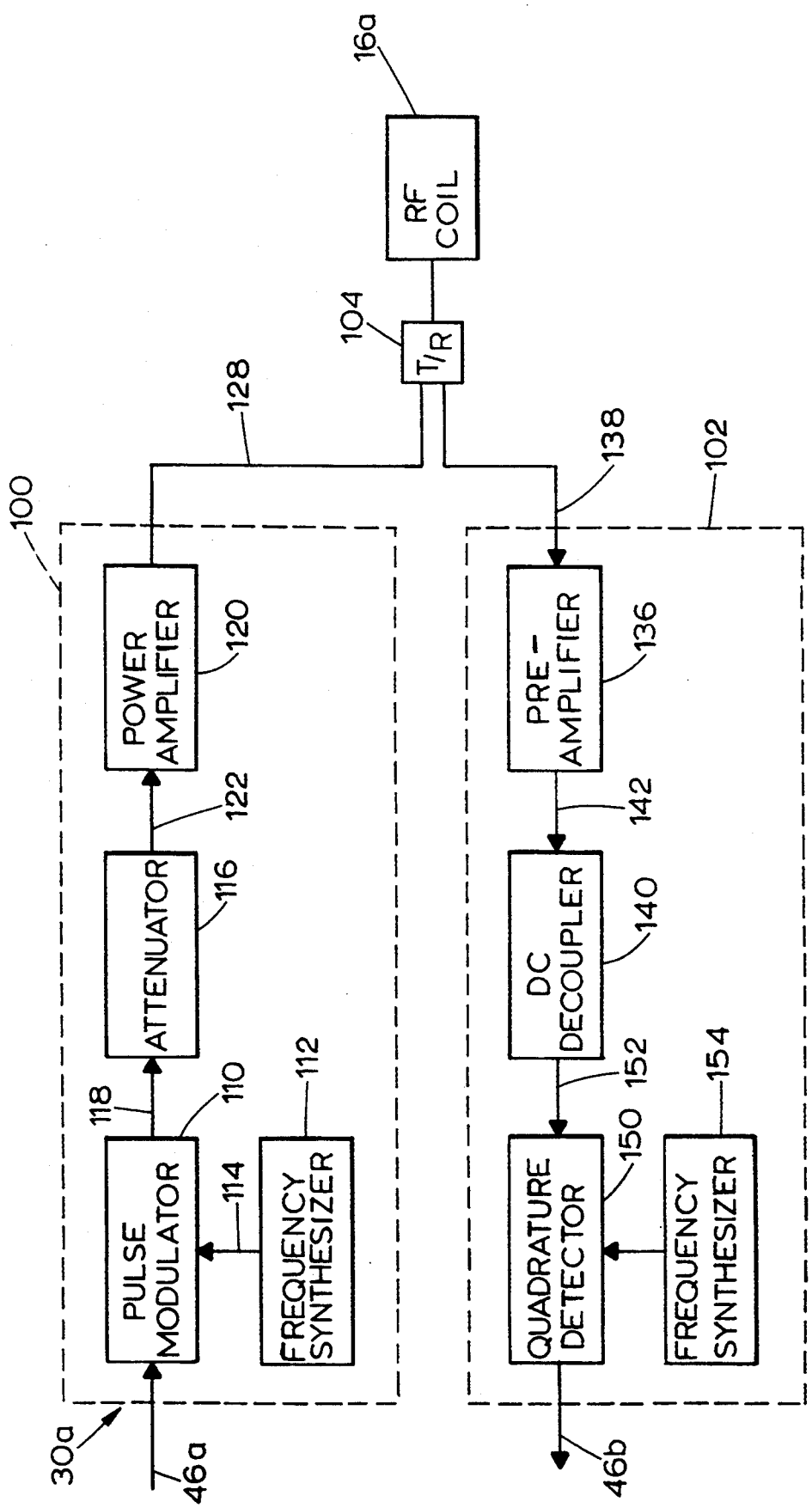
FIG. 3 is a block diagram of a first embodiment of the transceiver shown schematically in FIG. 1.

Referring to FIG. 3, a block diagram of one embodiment 30a of the transceiver 30 is shown. The transceiver 30a includes a transmitter 100, a receiver 102, and a passive transmit/receive (T/R) switch 104. The transmitter 100 periodically transmits the Hermitian pulses of the RF signal at a rate determined by TR, and the receiver 102 periodically receives the NMR signals generated by the magnetic resonance of the oxygen-17 constituents.

The transmitter 100 comprises a pulse modulator 110 coupled to a frequency synthesizer 112 via a line 114. The frequency synthesizer 112 generates an RF signal having a Larmor frequency that causes the oxygen-17 constituents to magnetically resonate. The pulse modulator 110 modulates the amplitude envelope of the RF signal generated by the frequency synthesizer 112 to generate the three-peak Hermitian pulse 72. The rate at which the Hermitian pulses 72 are generated is determined by a transmit signal provided to the pulse modulator 110 via a line 46a from the I/O interface circuit 36. The Hermitian pulse produced by the pulse modulator 110 is provided to an attenuator 116 via a line 118 and then to a high gain amplifier 120 via a line 122. The attenuator, which may be a Texcen Model RA-104, attenuates the amplitude of the Hermitian pulse so that it has a suitable magnitude for the amplifier 120, which then amplifies the Hermitian pulse and provides it to an RF coil 16a via a line 128. The amplifier 120 may be an ENI LPI-10 high power amplifier which provides about 60 dB of amplification.

After a Hermitian pulse is radiated by the RF coil (when a $G_x$ readout pulse occurs), the RF coil 16a will detect the electromagnetic field caused by nuclear magnetic resonance of the oxygen-17 constituents and will generate an oxygen-17 NMR signal as a result.

The NMR signal is provided from the RF coil 16a to a preamplifier 136 of the receiver 102 via a line 138. The preamplifier 136 amplifies the NMR signal and then passes it to a conventional DC decoupler circuit 140 via a line 142. The DC decoupler circuit 140 passes the NMR signal to a conventional quadrature detector 150 via a line 152. A frequency synthesizer 154 generates an RF signal having substantially the same frequency as the RF signal generated by the frequency synthesizer 112. The RF signal generated by the synthesizer 154 is used as a quadrature reference signal by the quadrature detector 150. The NMR signal is then provided to the interface circuit 36 via a line 46b. Based upon the NMR signals provided by the receiver 102, the controller 40 generates an image of the body portion in a conventional manner.

Figure 4:
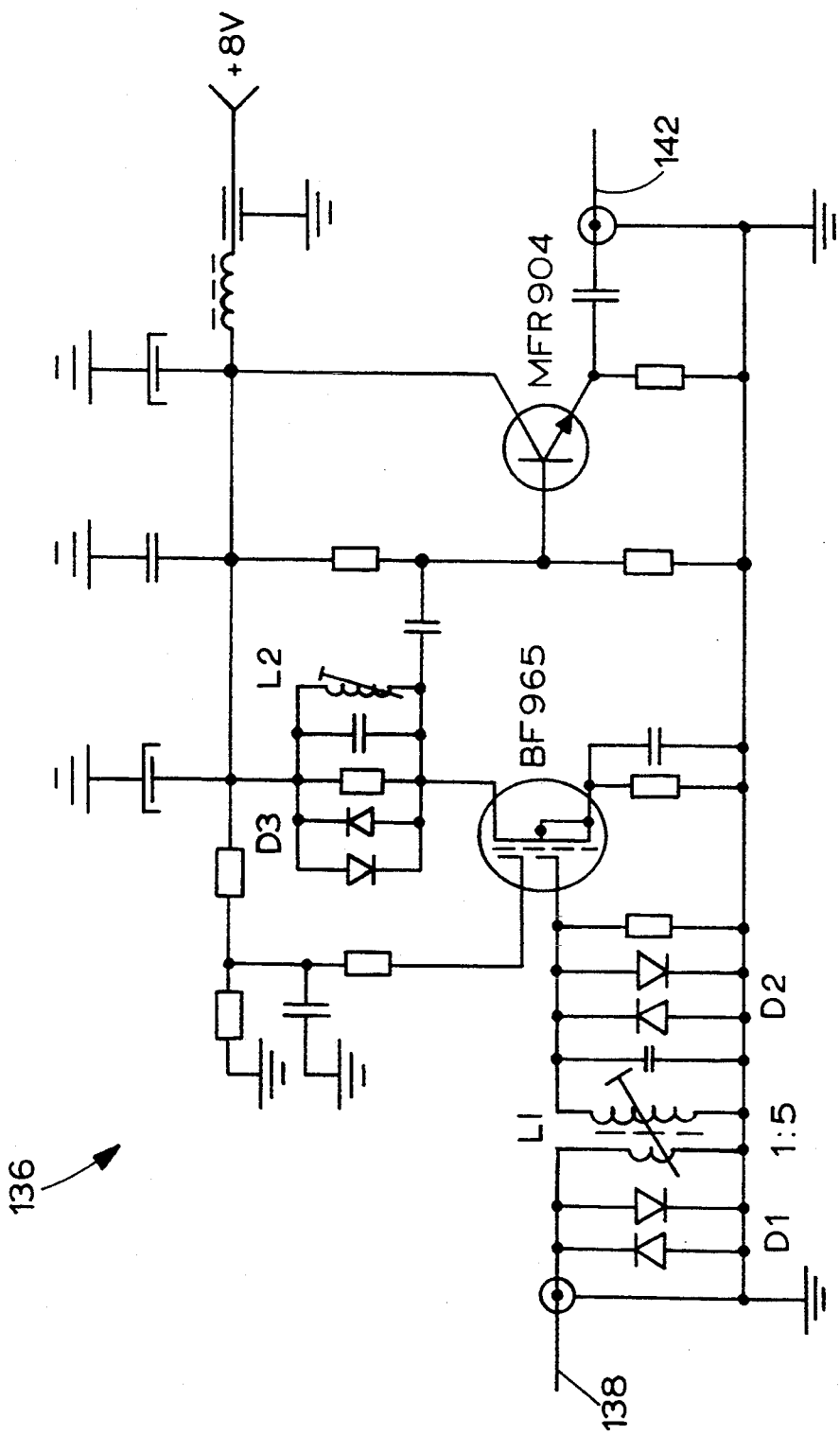
FIG. 4 is a circuit diagram of the preamplifier circuit shown schematically in FIG. 3.

A circuit diagram of the preamplifier 136 shown schematically in FIG. 3 is illustrated in FIG. 4. The preamplifier 136, which is advantageous in that it contributes to the increased S/N ratio of the NMR signals, is a low-noise, narrow band preamplifier circuit tuned for 8.657 MHz (the Larmor frequency for oxygen-17 at 1.5 Tesla) with a bandwidth of 0.2 MHz, a gain of 35 dB, and a noise factor of approximately 1.2 dB. The purpose of using a narrow-band tuned preamplifier is to decrease the noise factor of the preamplifier as much as possible. The preamplifier has two stages, a first stage connected in common-source configuration and including a field-effect transistor (FET) BF 965 and a resonant circuit L2 tuned to 8.657 MHz. The resonant circuit L1 at the input of the first stage is a step-up transformer to match the 50 ohm coaxial cable impedance to that of the preamplifier input impedance. The diodes D1, D2, D3, which may be NTE 519 fast switching diodes, protect the preamplifier 136 from long time saturation and/or damage. The second stage of the preamplifier 136 consists of a voltage follower (MFR 904) which matches the preamplifier output to the 50 ohm impedance of the coaxial cable. Although the preamplifier circuit is generally advantageous, the particular design of the circuit shown in FIG. 4 is not considered to be essential to the invention, and other designs could be utilized.

Figure 5:
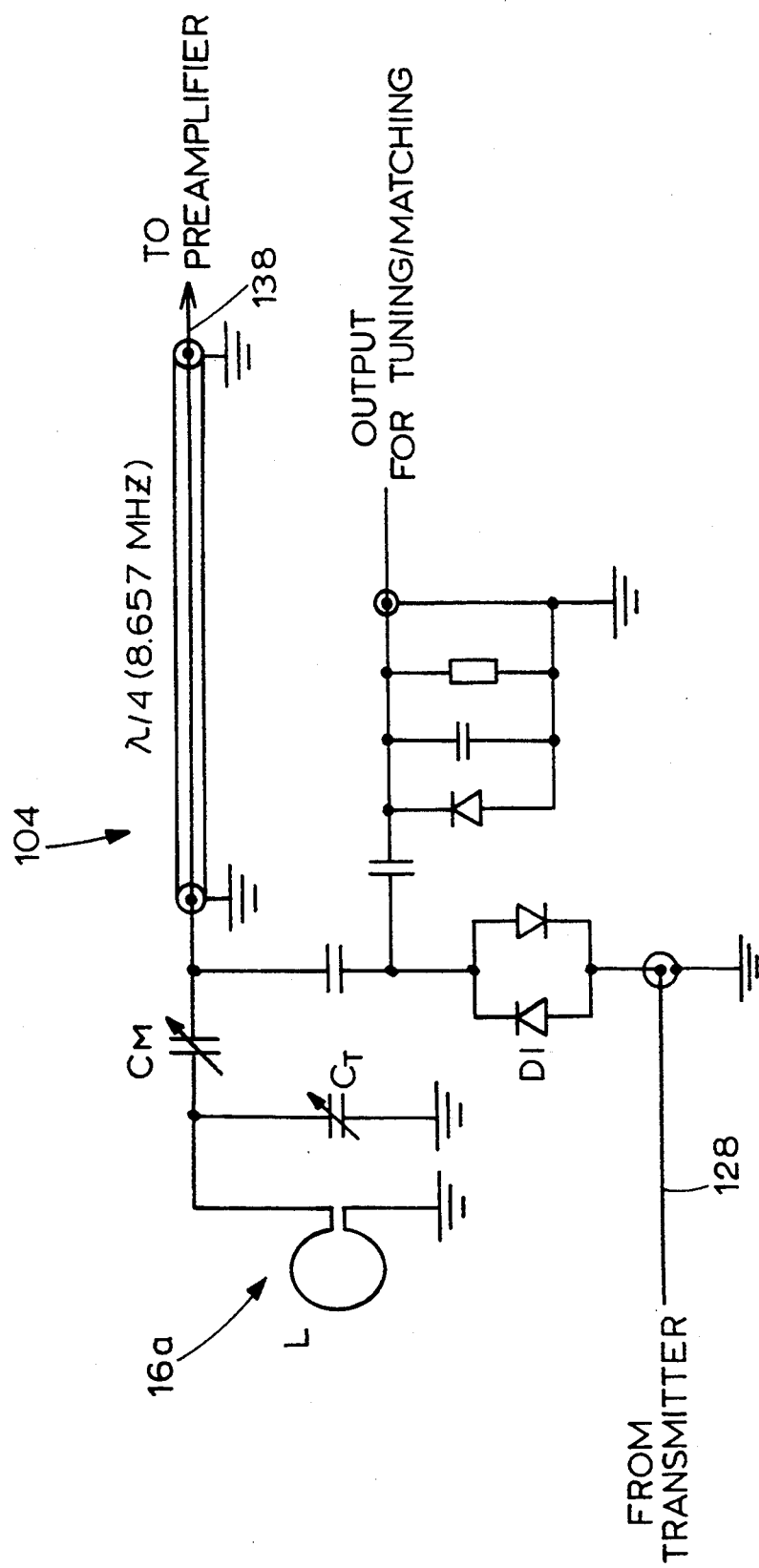
FIG. 5 is a diagram of the T/R switch and RF coil shown schematically in FIG. 3.

FIG. 5 illustrates the RF coil 16a and T/R switch 104. The RF coil 16a includes a coil element L formed of copper tubing and is used about the head of the patient. The diameter of the coil element is 14 centimeters and the diameter of the copper tubing is 0.25 inches. A tuning capacitor $C_T$ and a matching capacitor $C_M$ are connected to the coil element L for purposes of tuning the resonant frequency of the coil element L and for impedance matching purposes, respectively. The T/R switch 104 comprises a pair of crossed diodes D1 and $\lambda/4$ (oxygen-17) length coaxial cable grounded at both ends. During transmission, the cable is shorted to ground, and RF pulses primarily go to the coil element L, not to the preamplifier 136. During transmission, the dynamic impedance of the crossed diodes D1 is low; consequently, the impedance of the cable becomes high. During reception, the dynamic impedance of the crossed diodes rises; consequently, the impedance of the $\lambda/4$ cable decreases, allowing NMR signals from the coil element L to pass to the preamplifier 136. A further circuit is provided for generating an output which can be used during tuning and impedance matching of the coil 16a. The particular design of the coil 16a and associated electronics is not considered essential to the invention, and other designs could be used.

Figure 6:
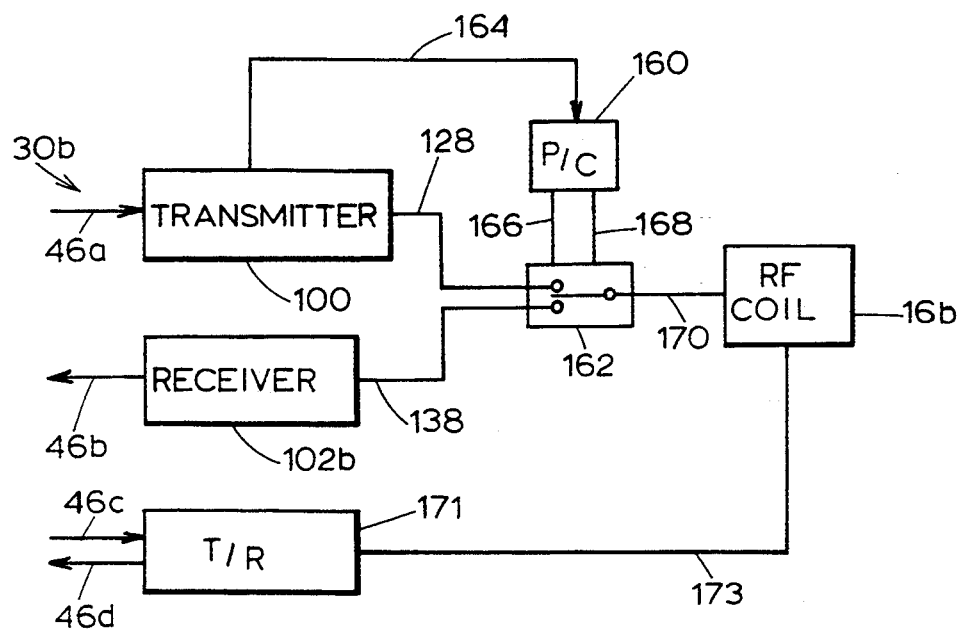
FIG. 6 is an alternative embodiment of the transceiver shown schematically in FIG. 1.

FIG. 6 is a block diagram of a second embodiment 30b of the transciever 30 shown schematically in FIG. 1 and a second embodiment 16b of the RF coil 16 shown schematically in FIG. 1. The second embodiment may be used in an NMR system which simultaneously generates NMR signals for both oxygen-17 and hydrogen-1 so that oxygen-17 images relating to blood flow and oxygen consumption can be superimposed with hydrogen-1 anatomical images.

The transceiver 30b includes a pulse converter (P/C) 160 coupled to an active transmit/receive (T/R) switch 162. The pulse converter 160 receives from the transmitter 100 via a line 164 a TTL level logic pulse, referred to herein as a unblanking pulse. The unblanking pulse is generated by the pulse modulator 110 (FIG. 3) of the transmitter 100, and is also provided to the amplifier 120 (FIG. 3). When the unblanking pulse, which is generated to coincide with each Hermitian pulse, is received by the pulse converter 160, the unblanking pulse is converted from TTL level to positive polarity pulses on a line 166 which causes the T/R switch 162 to connect the fine 128 to a line 170 connected to the RF coil 16b. In the absence of the unblanking pulse, the T/R switch 162 connects the line 170 to the line 138 so that NMR signals detected by the RF coil 16b are provided to the receiver 102b.

The transceiver 30b also includes a transmitter/receiver 171 connected to the RF coil 16b via a line 173 for transmitting RF signals at the hydrogen-1 Larmor frequency and receiving hydrogen-1 NMR signals.

Figure 7:
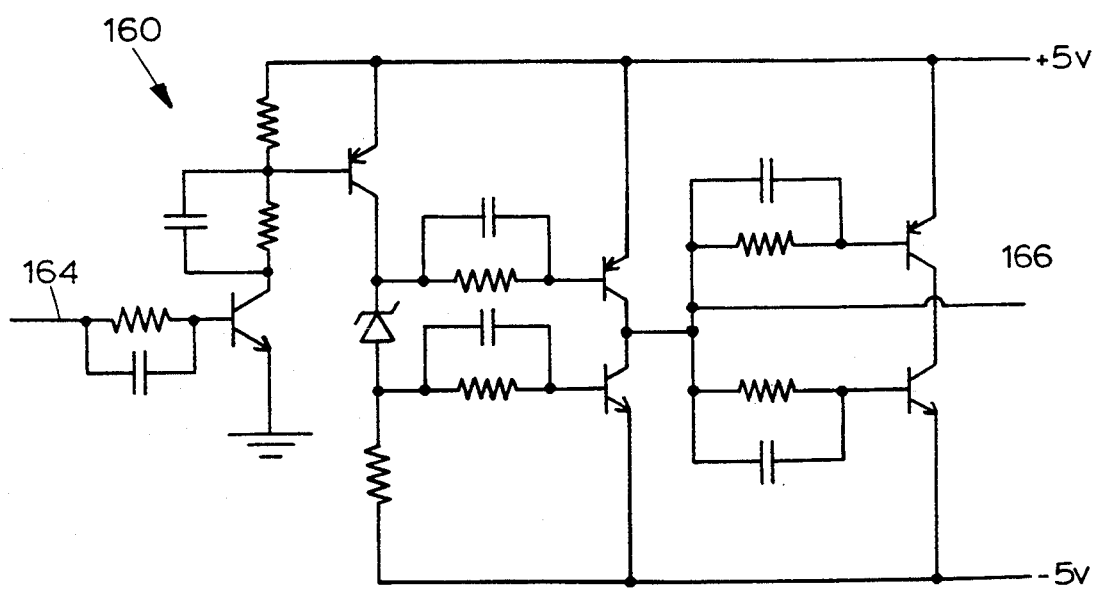
FIG. 7 is a circuit diagram of the pulse converter circuit shown schematically in FIG. 6.

A circuit diagram of the pulse converter 160 is shown in FIG. 7. The pulse converter 160 generates positive polarity pulses from the TTL level unblanking pulse and controls the T/R switch 162 based thereon. The particular circuit diagram shown is not essential for the invention and other designs may be used.

Figure 8:
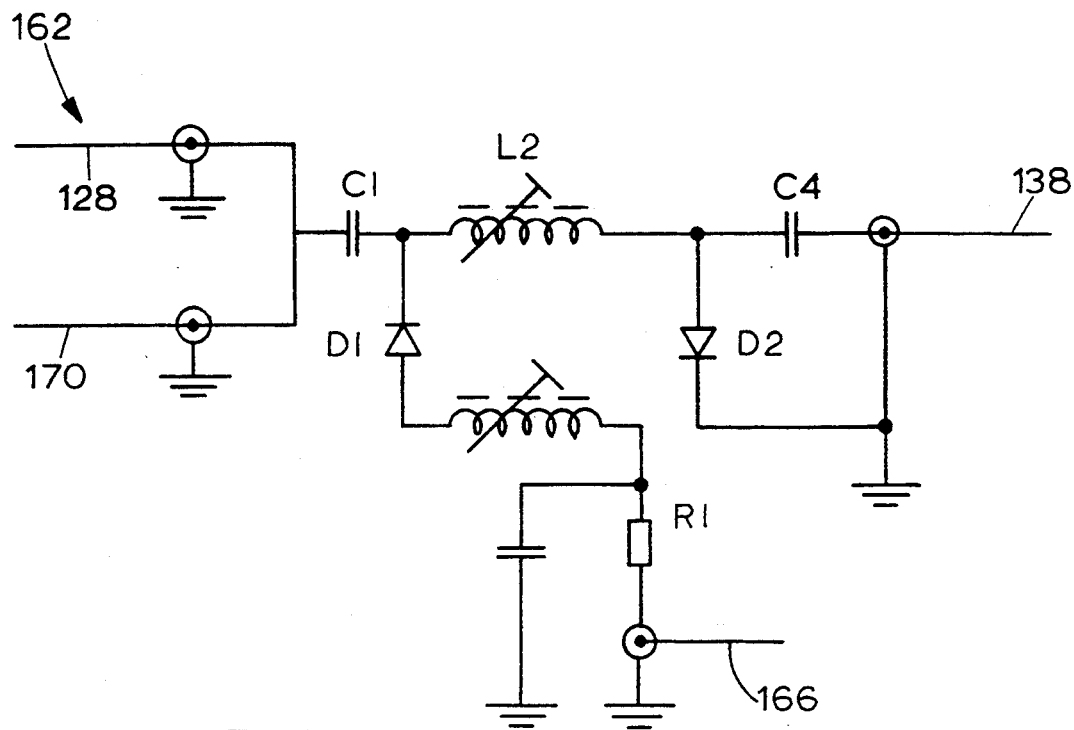
FIG. 8 is a circuit diagram of the transmit/receive switch shown schematically in FIG. 6.

A circuit diagram of the T/R switch 162 shown schematically in FIG. 6 is illustrated in FIG. 8. The T/R switch 162, which uses the properties of a PIN diode, works as a radio frequency attenuator when a DC current flows through it, which separates the transmitter 100 from the preamplifier of the receiver 102b, thus protecting the preamplifier from high power. During transmission, a positive voltage is generated on the input line 166 causes a flow of DC current through diodes D1 and D2 (each of which represents five diodes connected in series). As a result, the impedance of diodes D1 and D2 decreases to less than one ohm. The current is controlled by a resistor R1, and is selected according to the PIN diodes' specifications. Conducting diode D2 attenuates the power of pulses coming from the transmitter 100. When diode D2 is conducting, the transmitter 100 is connected only to the RF coil. During reception, a negative voltage is generated on the input line and turns off diodes D1 and D2, which cease to work as attenuators. NMR signals from the RF coil can therefore go through the T/R switch 162 with negligible losses of about 1.3 dB. Although the switch 162 is shown in detail, numerous other designs could be used.

Figure 9:
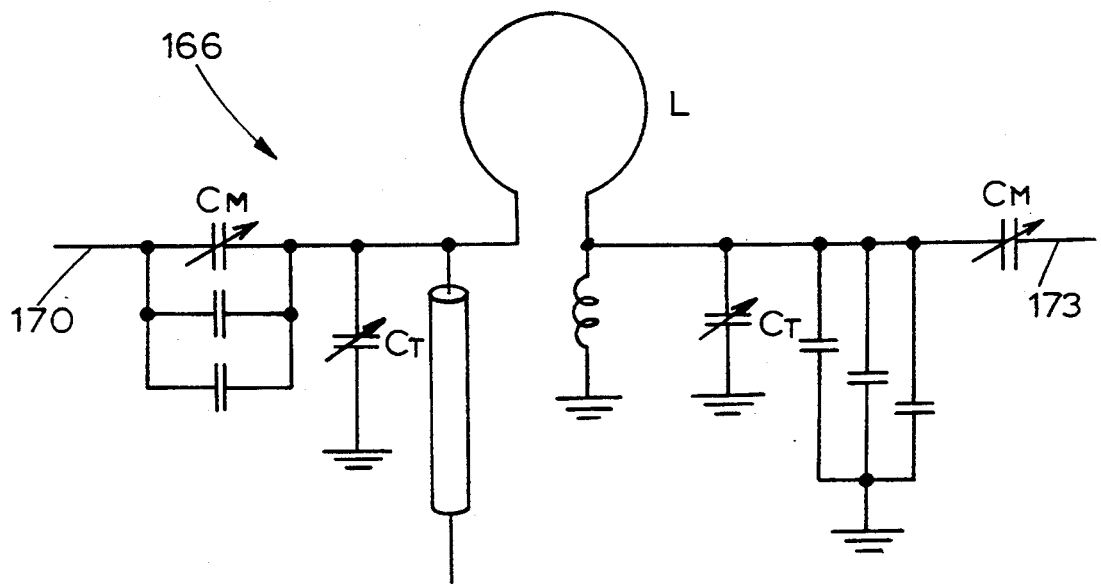
FIG. 9 is a diagram of an alternative RF coil circuit.

An RF coil 16b for allowing simultaneous or concurrent magnetic resonance of oxygen-17 and hydrogen-1 constituents in a human body portion in which case oxygen-17 images relating to blood flow and oxygen consumption can be superimposed on hydrogen-1 anatomical images, and associated circuit components are shown in FIG. 9. The RF coil 16b includes a coil element L formed of copper tubing and is used about the head of the patient. The diameter of the coil element L is 11 centimeters and the diameter of the copper tubing is 0.5 cm.

A tuning capacitor $C_T$ and a matching capacitor $C_M$ are connected to each side of the coil element L for purposes of tuning the resonant frequencies of the coil element L to the hydrogen-1 and oxygen-17 Larmor frequencies and for impedance matching purposes, respectively. In operation, the left-hand terminal of the RF coil 16b would be connected to receive RF signals at the oxygen-17 frequency and to transmit oxygen-17 NMR signals via the line 170, and the right-hand terminal of the RF coil 16b would be connected to receive RF signals at the hydrogen-1 frequency and to transmit hydrogen-1 NMR signals via the line 173. A λ/4 (hydrogen-1) length coaxial cable is attached to bottom left portion of the coil element to prevent hydrogen-1 NMR signals from reaching the oxygen-17 end of the coil element, and a dual loop is formed in the bottom right hand portion of the coil element to prevent oxygen-17 NMR signals from reaching the hydrogen-1 end of the coil element. The two loops are three centimeters in diameter, are formed of the same copper tubing of the coil element L, and generate a magnetic field in the same direction of the static field. The particular design of the coil 16b and associated electronics is not considered essential to the invention, and other designs could be used.

Figure 10:
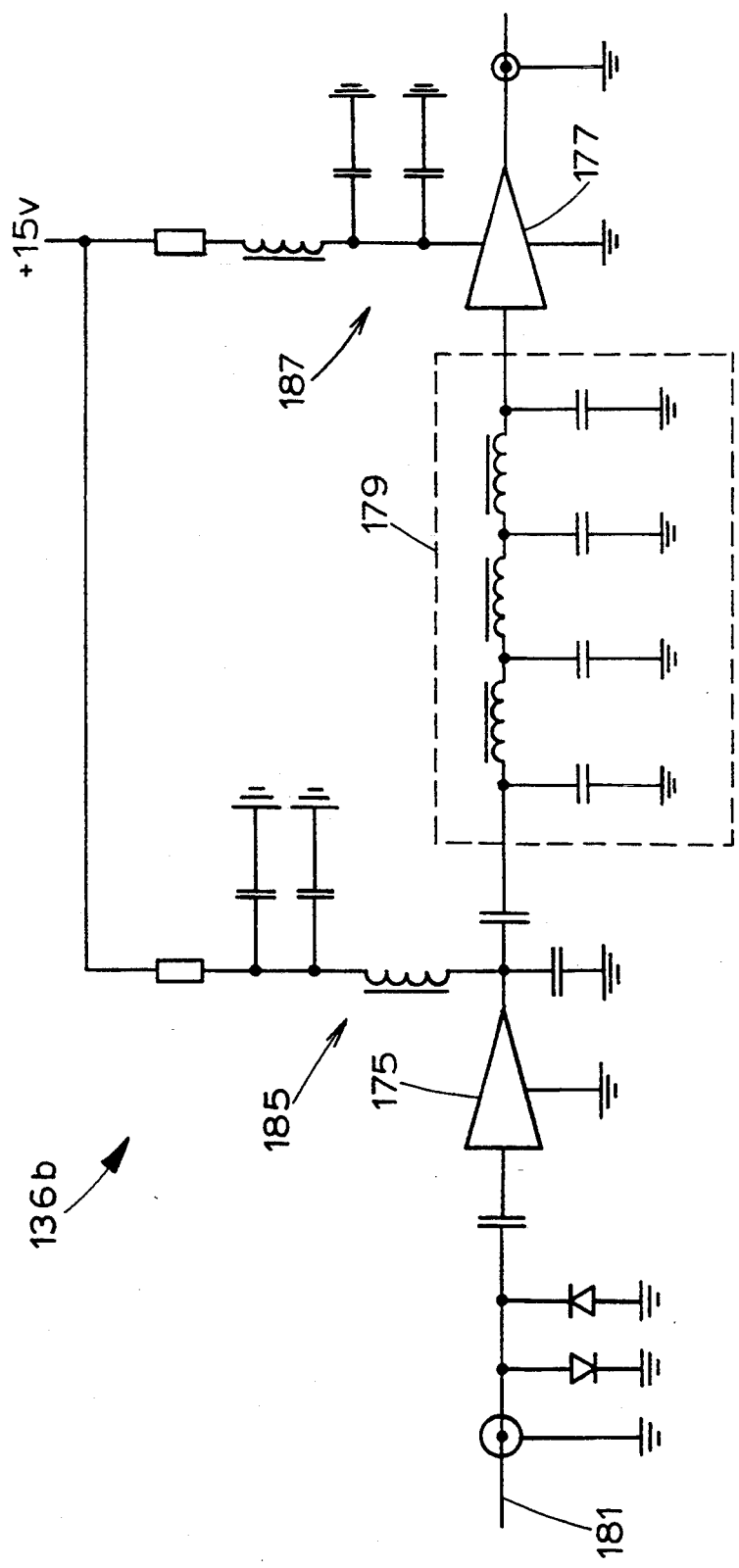
FIG. 10 is an alternative embodiment of a preamplifier circuit.

A circuit diagram of an alternative embodiment 136b of a preamplifier circuit of FIG. 6 is shown in FIG. 10. The preamplifier circuit 136b has a relatively wide bandwidth and may be used to amplify both oxygen-17 and xenon-129 NMR signals. The preamplifier circuit 136 comprises two low-noise, broad-band monolithic amplifiers 175, 177 connected in series. The preamplifier circuit 136b has a 21 MHz bandwidth determined by an LC band-pass filter 179 connected between the amplifiers 175, 177. The bandwidth is selected to include the Larmor frequencies of both oxygen-17 and xenon-129 (which may also be used in NMR). The preamplifier 136b is protected by a pair of crossed diodes at the input 181, which attenuate all signals to less than one volt, as their dynamic impedance decreases dramatically when the voltage is higher than 07 volts. RC filters 185, 187 provide current to the amplifiers 175, 177, thus isolating the power supply from high frequencies. Other designs could be used.

Determination of Oxygen Consumption and Blood Flow Rates

The NMR system 10 described above has the capability to generate NMR data representing the concentration of oxygen-17 within a point or pixel of a single planar slice, a single planar slice, or a plurality of planar slices which together represent a 3-dimensional volume of any preselected body portion of a live human being.

The rate of oxygen consumption and the magnitude of blood flow at any given point, slice or volume of a body portion of a patient can be quantitatively determined by having the patient inhale oxygen-17 enriched air for a period of time and by measuring the rate at which the oxygen-17 concentration changes within the body portion. Since the natural abundance of oxygen-17 in oxygen molecules in the air is 0.037 %, the inhalation and subsequent consumption of such air during metabolic processes results in the water of the tissues in humans and animals having a natural abundance of $H_2^{17}O$ also of 0.037%. Thus, when a patient breathes oxygen-17 enriched air, due to the metabolism of that air, the concentration of $H_2^{17}O$ in the tissues, which is detected by oxygen-17 NMR, increases. As described in detail below, by analyzing the rate of increase, the rate of oxygen consumption and the magnitude of blood flow can be quantitatively determined.

During the metabolism of glucose in the tissues of the body, the oxygen atoms in the oxygen molecules are transferred to the $H_2O$ molecule produced. Thus, the oxygen-17 atoms of any oxygen-17 molecules which metabolize glucose result in the production of $H_2^{17}O$ molecules as set forth in the equation below:

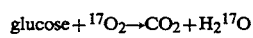

$$\text{glucose} + {}^{17}O_2 \rightarrow CO_2 + H_2{}^{17}O$$

The $^{17}O_2$ molecules, which are bound to hemoglobin as oxyhemoglobin, are not detectable by oxygen-17 NMR due to their being bound to the large hemoglobin molecule. Oxygen-17 NMR detects only the oxygen-17 present in the $H_2^{17}O$ (oxygen-17 water) molecule. Since the production of oxygen-17 water is directly associated with the consumption of oxygen-17, the latter can be quantitatively determined from the detected rate of production of oxygen-17 water.

Figure 11A:
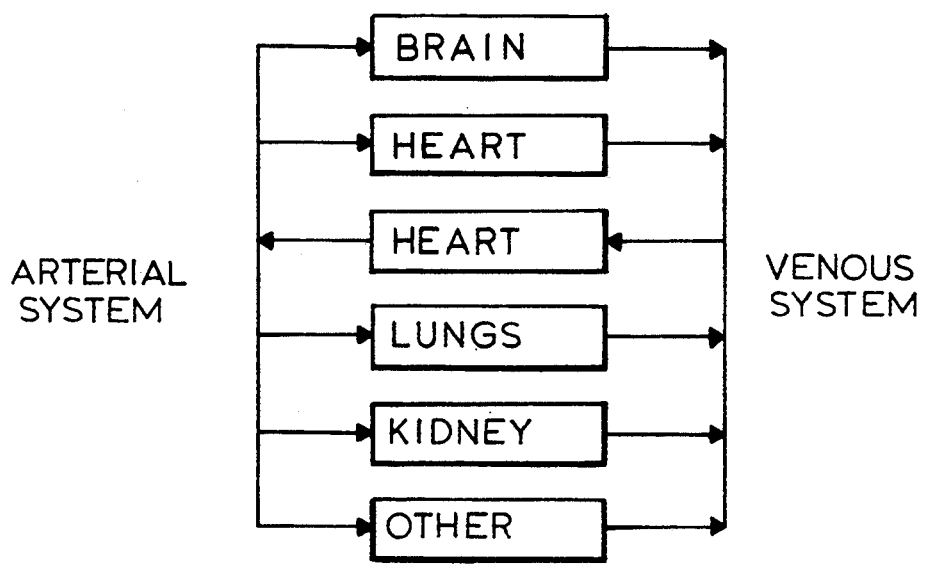
FIG. 11a is a schematic diagram illustrating a number of organs in the human body.

Referring to FIG. 11a, a portion of the anatomy of a human is schematically shown as including the brain, heart, lungs, and other organs interconnected by the arterial and venous systems. The arrows indicate the direction of blood flow. The heart is shown as a first portion which requires a source of arterial blood and a second portion which acts as a blood pump.

Figure 11B:
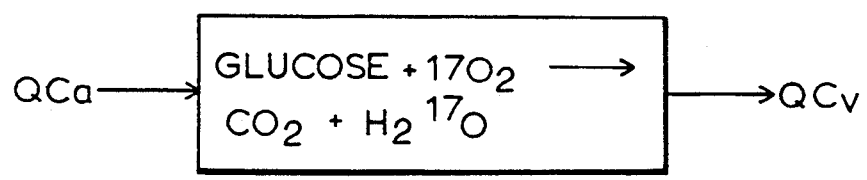
FIG. 11b is a schematic diagram illustrating the components of $H_2{}^{17}O$ production in tissue in the human body.

FIG. 11 b illustrates the factors which affect the concentration of oxygen-17 water in one organ, such as the brain. Those factors include: 1) the concentration of oxygen-17 water in the blood flowing into the organ, represented by the quantity $QC_a$, where Q is the quantity of blood flow and where $C_a$ is the concentration of oxygen-17 water in the arterial system; 2) the concentration of oxygen-17 water in the blood flowing out of the organ, represented by the quantity $QC_v$ where Q is the quantity of blood flow and where $C_v$ is the concentration of oxygen-17 water in the venous system; and 3) the rate at which oxygen-17 water is metabolically produced within the organ from $^{17}$O-oxyhemoglobin.

Assume that $C_B$ represents the concentration of $H_2^{17}O$ in the brain. It can be seen that the rate of change of $C_B$ with time ("$dC_B/dt$") is related to the above factors in accordance with the following equation:

$$dC_B/dt = CMR^{17}O_2 + Q(C_a - C_v),$$

where $CMR^{17}O_2$ represents the amount of oxygen-17 water produced by the brain during metabolism of glucose, which amount depends on the cerebral metabolism rate. The first $CMR^{17}O_2$ component above is referred to herein as the "metabolism" component, and the second $Q(C_a - C_v)$ component is referred to herein as the "reflow" component.

To determine the rates of oxygen consumption and blood flow within a portion of tissue in a living human patient, the patient is instructed to inhale a gas containing a concentration of oxygen-17 substantially different than natural abundance, which is 0.037%, for a predetermined period of time. Preferably, the inhaled gas is oxygen-17 enriched air containing at least 10% or 20% of oxygen-17. During the first part of the inhalation period, the patient may be instructed to take several deep breaths of the oxygen-17 enriched air so that the natural air in the volume of the patient's lungs is promptly displaced with oxygen-17 enriched air. During the inhalation period, the concentration of $H_2^{17}O$ in the tissues will increase above the natural abundance level of 0.037%, initially due to the metabolism component and subsequently due to both the metabolism and reflow components. When the inhalation period is completed and the patient resumes inhalation of non-oxygen-17 enriched air, the concentration of $H_2^{17}O$ in the tissue will decrease until reaches the natural abundance level. This latter period is referred to as the "washout" period.

Figure 12:
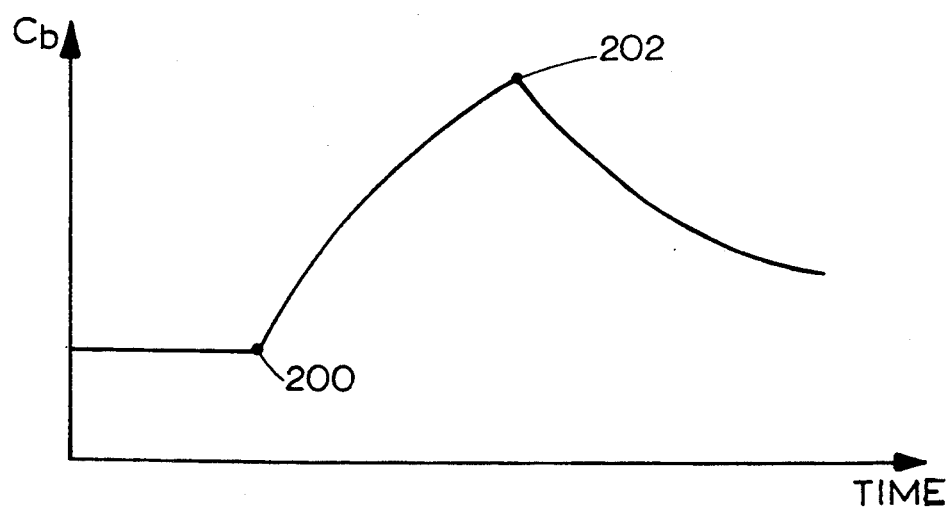
FIG. 12 illustrates the concentration of $H_2{}^{17}O$ over time in a portion of tissue during inhalation of enriched oxygen-17.

FIG. 12 illustrates graphically the concentration of $H_2^{17}O$ in tissue during the pre-inhalation period, where the concentration is constant at the natural abundance level, during the inhalation period beginning at a point 200 in time, and during the washout period, which begins at a point 202 in time.

Figure 13:
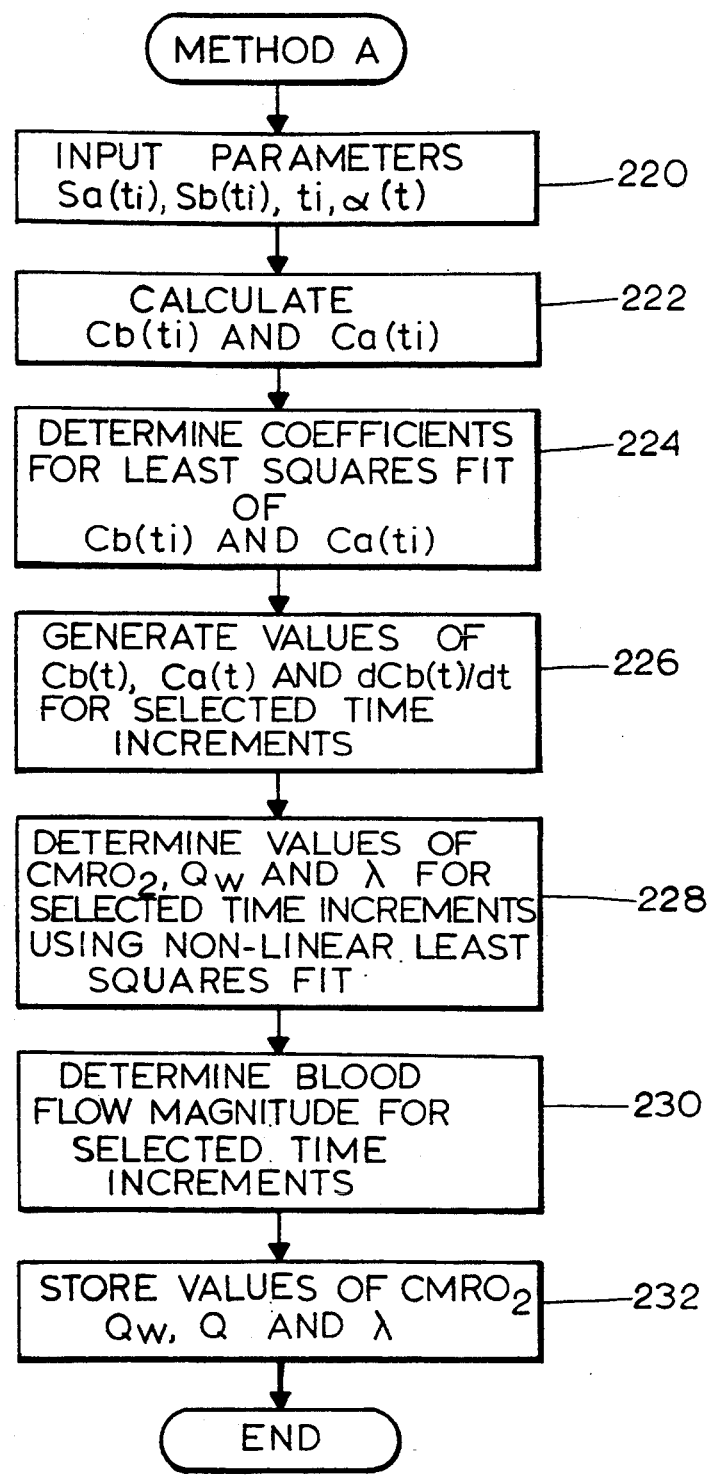
FIGS. 13–16 illustrate various methods of determining the oxygen-17 consumption and/or blood flow rates in a body portion of a human being.

FIG. 13 is a flowchart of a computer program utilizing a first method of determining the oxygen consumption and blood flow rates within a selected portion of tissue within a human patient. Prior to the performance of the method of FIG. 13, the patient breathes oxygen-17 enriched air as described above. Oxygen-17 NMR signals are periodically generated during the inhalation period and for a portion of the pre-inhalation period for the selected body portion. For example, oxygen-17 NMR signals for the selected body portion could be generated once during the pre-inhalation period and once every 10 seconds during the inhalation period. Also, during a portion of the pre-inhalation period and during the inhalation period, oxygen-17 NMR signals are also generated for the aorta artery to determine the $C_a$ factor described above. This could be achieved by using a separate RF coil positioned adjacent the aorta.

Referring to FIG. 13, at step 220 a number of parameters are input. The parameters include $S_a(t_i)$, which represents the oxygen-17 NMR signal magnitudes periodically generated from the RF coil positioned adjacent the aorta. $S_b(t_i)$ represents the oxygen-17 NMR signal magnitudes periodically generated from the selected tissue portion for which blood flow and oxygen consumption are to be determined. $t_i$ represents the times at which the $S_a(t_i)$ and $S_b(t_i)$ signals were generated, and $\alpha(t)$ represents the molar fraction of oxygen-17 in the gas inhaled by the patient at each of the times at which the $S_a(t_i)$ and $S_b(t_i)$ signals are generated. $\alpha(t)$ may be constant over time, such as 0.1 which corresponds to 10% oxygen-17. Alternatively, the concentration of $^{17}O$ oxyhemoglobin may be periodically measured based on the mass spectrometric determination of periodically withdrawn blood samples or may be calculated on the basis of known physiological parameters.

At step 222, the magnitudes of $C_b(t_i)$, which represents the change in oxygen-17 water concentration in the selected tissue portion, and $C_a(t_i)$, which represents the change in the oxygen-17 water concentration in the aorta, are determined in accordance with the following equations:

$$C_b(t_i) = 20.538 \times [(S_b(t_i) - S_b(background)/S_b(background)]$$

$$C_a(t_i) = 20.538 \times [(S_a(t_i) - S_a(background)/S_a(background)],$$

where $S_a(background)$ and $S_b(background)$ represent the oxygen-17 NMR signal magnitudes during the pre-inhalation period and where 20.538 is the natural abundance concentration of oxygen-17 water in micromoles/gram water.

It is unlikely that the raw NMR data represented by the $C_a$ and $C_b$ points over time will form a perfectly smooth curve over time. To generate a smooth curve, an approximation curve, such as a least squares fit curve, is determined based on the raw data points to determine the coefficients of a smooth curve. At step 224, a second-order polynomial least squares fit is determined for $C_b$ and $C_a$ in accordance with the following equations:

$$C_b(t_i) = A + Bt + Ct^2$$

$$C_a(t_i) = D + Et + Ft^2$$

As a result of the least squares fit, the coefficients A through F are determined. The above least squares fit is accomplished by a computer program entitled "Polynomial General Linear Models Least Squares Fit" commercially available from the SAS Institute. Alternatively, instead of performing a polynomial least squares fit, an exponential least squares fit could be performed.

At step 226, using the coefficients determined in step 224, the values of $C_b(t)$, $C_a(t)$ and $dC_b(t)/dt$ are generated for selected time intervals, such as every second for example. The values of $dC_b(t)/dt$ are generated based upon the derivative of $C_b(t)$, which is $B + 2Ct$.

At step 228, the values of $CMRO_2$, $Q_w$ and $\lambda$ are determined for the selected time increments in accordance with the following equation:

$$dC_b(t)/dt = 2\alpha(t) \times CMRO_2/f_1 + Q_w(C_a(t) - C_b(t)/\lambda),$$

where $CMRO_2$ represents the concentration of oxygen consumption in the selected tissue, where $f_1$ represents the weight fraction of water in the selected tissue, where $Q_w$ represents the magnitude of water flow per gram of water of the selected tissue, and where $\lambda$ represents the tissue/blood partition coefficient for the selected tissue. The step 228 is accomplished by a computer program entitled "Non-Linear Least Squares Fit" commercially available from the SAS Institute.

At step 230, the blood flow magnitude Q (rate of organ blood flow/gram tissue) is determined in accordance with the following equation:

$$Q = Q_w f_2 d / f_1,$$

where $f_2$ is the weight fraction of water in blood (a known constant), $f_1$ is the weight fraction of water in the tissue (a known constant) and d is the density of the blood (a known constant). At step 232, the values of CMRO$_2$, Q$_w$, Q and λ determined above are stored in memory.

Figure 14:
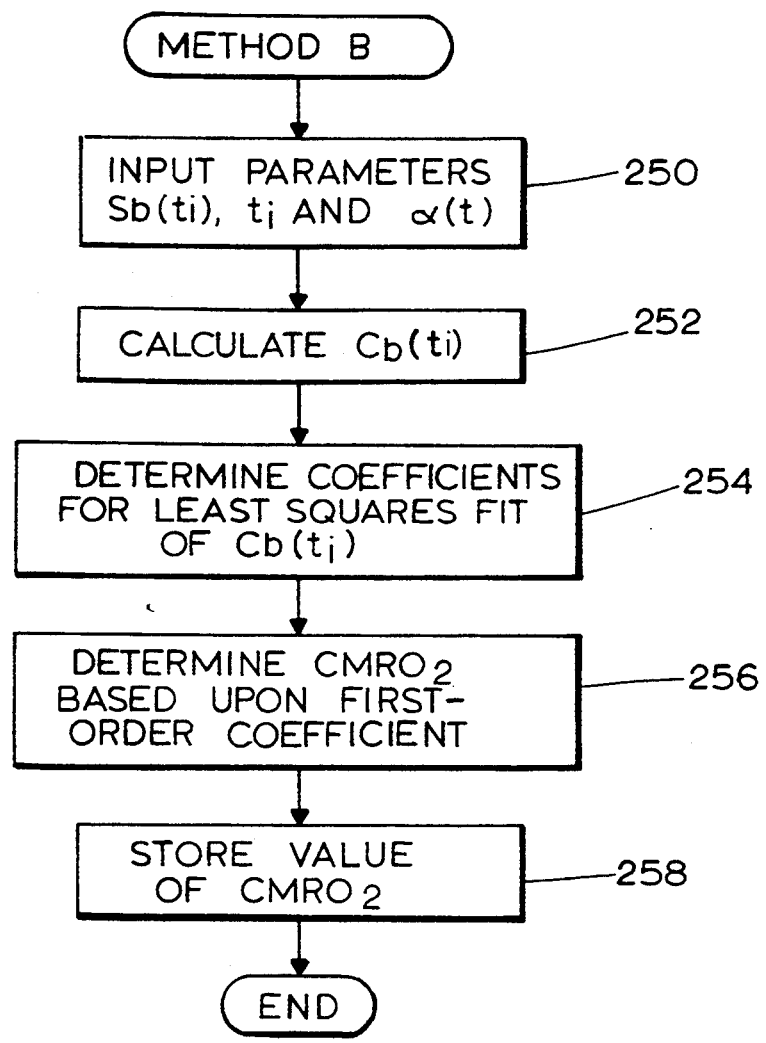

A second method of determining the magnitude of oxygen consumption in a selected portion of tissue is set forth in the flowchart of FIG. 14. The second method does not require the determination of $C_a(t_i)$ as determined by the separate RF coil adjacent the aorta.

Referring to FIG. 14, at step 250 a number of parameters are input. The parameters include $S_b(t_i)$, which represents the oxygen-17 NMR signal magnitudes periodically generated from the selected tissue portion for which oxygen consumption is to be determined. $t_i$ represents the times at which the $S_b(t_i)$ signals were generated, and α(t) represents the percentage of oxygen-17 in the gas inhaled by the patient at each of the times at which the $S_b(t_i)$ signals are generated.

At step 252, the magnitude of $C_b(t_i)$, which represents the change in oxygen-17 water concentration in the selected tissue portion, is determined in accordance with the following equation:

$$C_b(t_i) = 20.538 \times [(S_b(t_i) - S_b(background)/S_b(background)]$$

where $S_b(background)$ represents the oxygen-17 NMR signal magnitudes during the pre-inhalation period and where 20.538 is the natural abundance concentration of oxygen-17 water in micromoles/gram water.

At step 254, a second-order polynomial least squares fit is determined for $C_b$ in accordance with the following equation:

$$C_b(t_i) = A + Bt + Ct^2$$

As a result of the least squares fit, the coefficients A through C are determined. The above least squares fit is accomplished by a computer program entitled "General Linear Models Least Squares Fit" commercially available from the SAS Institute. Alternatively, instead of performing a polynomial least squares fit, an exponential least squares fit could be performed in accordance with the following equation:

$$C_b(t_i) = B + A \times (1 - e^{-Kt})$$

At step 256, if a polynomial least squares fit was used in step 254, the value of CMRO$_2$ is determined in accordance with the following equation:

$$CMRO_2 = B \times f_1 / 2\alpha$$

If an exponential least squares fit was used in step 254, the value of CMRO$_2$ is determined in accordance with the following equation:

$$CMRO_2 = A \times K \times f_1 / 2\alpha$$

At step 258, the value of CMRO$_2$ determined above is stored in memory.

Figure 15:
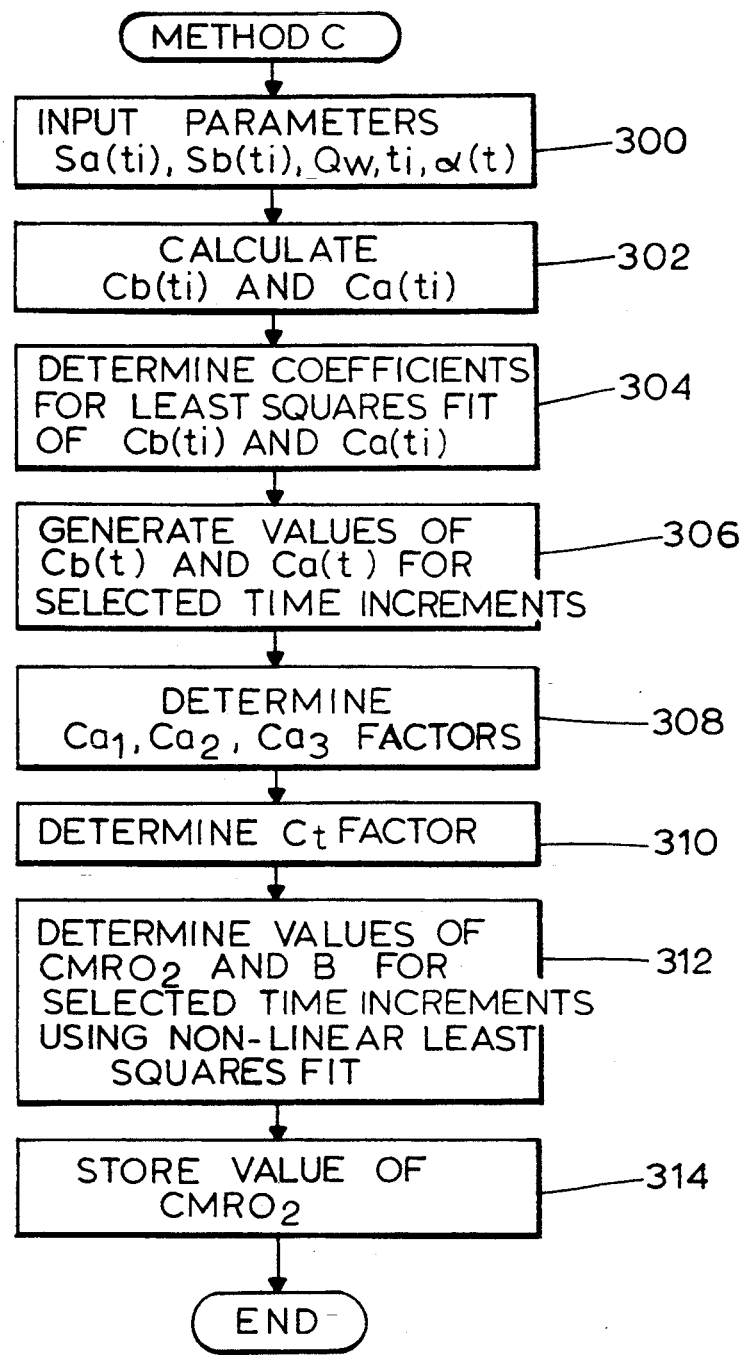

A third method of determining the magnitude of oxygen consumption in a selected portion of tissue is set forth in the flowchart of FIG. 15. Referring to FIG. 15, at step 300 a number of parameters are input. The parameters include $S_a(t_i)$, which represents the oxygen-17 NMR signal magnitudes periodically generated from the RF coil positioned adjacent the aorta. $S_b(t_i)$ represents the oxygen-17 NMR signal magnitudes periodically generated from the selected tissue portion for which oxygen consumption is to be determined. $t_i$ represents the times at which the $S_a(t_i)$ and $S_b(t_i)$ signals were generated, α(t) represents the percentage of oxygen-17 in the gas inhaled by the patient at each of the times at which the $S_a(t_i)$ and $S_b(t_i)$ signals are generated, and Q$_w$ represents the magnitude of water flow per gram of water of the selected tissue. The magnitude of Q$_w$ may be taken from the literature; it may be determined via the first method described above; or it may be determined based upon NMR of the patient during inhalation of $^{129}$Xe.

If the magnitude of Q$_w$ is determined based upon $^{129}$Xe inhalation, the gaseous mixture inhaled by the patient may be, for example, 20% $^{17}$O$_2$, 40% nitrogen, and 40% xenon, and the metabolic oxygen consumption rate (based on oxygen-17 NMR) and Q$_w$ (based on xenon-129 NMR) could be determined based on the same inhalation period. The natural abundance of $^{129}$Xe in xenon gas is 26.24%. Q$_w$ can be determined based upon $^{129}$Xe NMR signals received from an RF coil tuned to the Larmor frequency for $^{129}$Xe and by using a preamplifier having a bandwidth that includes the $^{129}$Xe Larmor frequency. Although Q$_w$ could be determined based upon $^{129}$Xe NMR, methods of determining the magnitude of blood flow based upon the detection of tracer agents are conventional, and the details of such methods are not considered important to the present invention.

At step 302, the magnitudes of $C_b(t_i)$, which represents the change in oxygen-17 water concentration in the selected tissue portion, and $C_a(t_i)$, which represents the change in the oxygen-17 water concentration in the aorta, are determined in accordance with the following equations:

$$C_b(t_i) = 20.538 \times [(S_b(t_i) - S_b(background)/S_b(background)]$$

$$C_a(t_i) = 20.538 \times [(S_a(t_i) - S_a(background)/S_a(background)],$$

where $S_a(background)$ and $S_b(background)$ represent the oxygen-17 NMR signal magnitudes during the pre-inhalation period and where 20.538 is the natural abundance concentration of oxygen-17 water in micromoles/gram water.

At step 304, a second-order polynomial least squares fit is determined for $C_b$ and $C_a$ in accordance with the following equations:

$$C_b(t_i) = A + Bt + Ct^2$$

$$C_a(t_i) = D + Et + Ft^2$$

As a result of the least squares fit, the coefficients A through F are determined. The above least squares fit is accomplished by a computer program entitled "Polynomial General Linear Models Least Squares Fit" commercially available from the SAS Institute. Alternatively, instead of performing a polynomial least squares fit, an exponential least squares fit could be performed.

At step 306, using the coefficients determined in step 304, the values of $C_b(t)$ and $C_a(t)$ are generated for selected time intervals. At step 308, three factors $C_{a1}$, $C_{a2}$, $C_{a3}$, which are used subsequently to determine $CMRO_2$, are determined in accordance with the following equations:

$$C_{a1} = (A/Q_w) \times (e^{Q_wt} - 1)$$

$$C_{a2} = (B/Q_w) \times (te^{Q_wt} - e^{Q_wt}/((Q_w+1) \times Q_w))$$

$$C_{a3} = (C/Q_w) \times (t^2 e^{Q_wt} - (2t/Q_w)e^{Q_wt}) + (C/Q_w) \times (2e^{Q_wt}/))Q_w - 2) \times Q_w))$$

At step 310, a factor Ct is determined based upon the $C_{a1}$, $C_{a2}$, and $C_{a3}$ factors determined in step 308 in accordance with the following equation:

$$Ct = Q \times e^{-Q_wt} \times (C_{a1} + C_{a2} + C_{a3})$$

At step 312, the value of $CMRO_2$ is determined in accordance with the following equation:

$$dC_b(t)/dt = 2\alpha(t) \times CMRO_2/(f_1 \times Q_w) \times (1 - e^{-Q_wt}) + Ct + B$$

The step 312 is accomplished by a computer program entitled "Non-Linear Least Squares Fit" commercially available from the SAS Institute. At step 314, the value of $CMRO_2$ is stored in memory.

Figure 16:
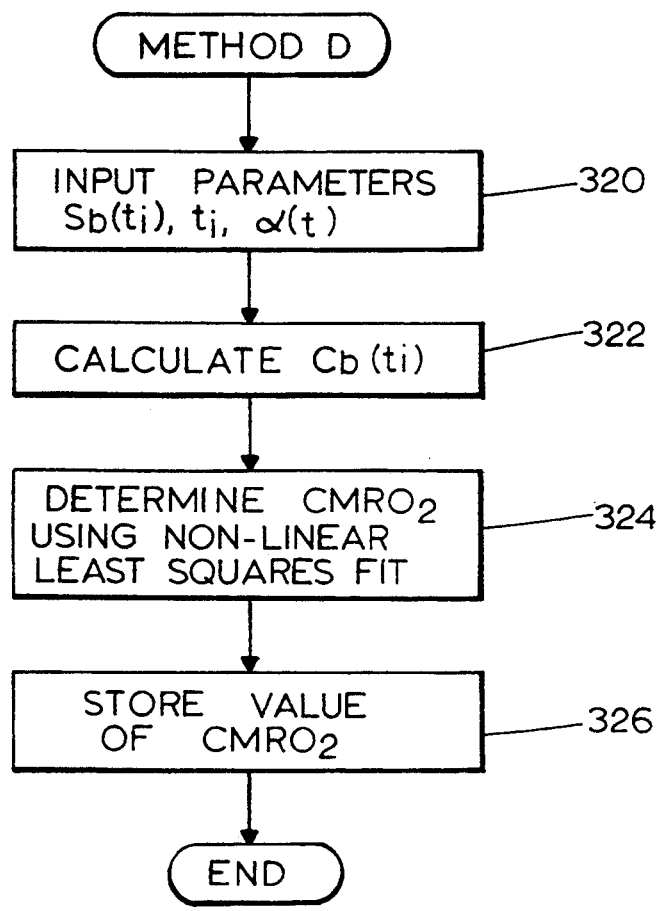

A fourth method of determining the magnitude of oxygen consumption in a selected portion of tissue is set forth in the flowchart of FIG. 16. The fourth method does not require the determination of $C_a(t_i)$ as determined by the separate RF coil adjacent the aorta.

Referring to FIG. 16, at step 320 a number of parameters are input. The parameters include $S_b(t_i)$, which represents the oxygen-17 NMR signal magnitudes periodically generated from the selected tissue portion for which oxygen consumption is to be determined. $t_i$ represents the times at which the $S_b(t_i)$ signals were generated, and $\alpha(t)$ represents the percentage of oxygen-17 in the gas inhaled by the patient at each of the times at which the $S_b(t_i)$ signals are generated.

At step 322, the magnitude of $C_b(t_i)$, which represents the change in oxygen-17 water concentration in the selected tissue portion, is determined in accordance with the following equation:

$$C_b(t_i) = 20.538 \times [(S_b(t_i) - S_b(background)/S_b(background)]$$

where $S_b(background)$ represents the oxygen-17 NMR signal magnitudes during the pre-inhalation period and where 20.538 is the natural abundance concentration of oxygen-17 water in micromoles/gram water.

At step 324, the value of $CMRO_2$ is determined in accordance with the following equation:

$$C_b(t_i)/dt = [2\alpha(t)/(Q_w \times P \times f_1)] \times CMRO_2 \times (1 - e^{-Q_w \times Pt})$$

In the above equation, P is equal to $1/\lambda - 1/k$, where $\lambda$ is the brain/venous blood partition coefficient and where k is the brain/arterial blood partition coefficient. Step 324 is accomplished by a computer program entitled "Non-Linear Least Squares Fit" commercially available from the SAS Institute. At step 326, the value of $CMRO_2$ is stored in memory.

Numerous modifications and alternative embodiments of the invention will be apparent to those skilled in the art in view of the foregoing description. This description is to be construed as illustrative only, and is for the purpose of teaching those skilled in the art the best mode of carrying out the invention. The details of the structure and method may be varied substantially without departing from the spirit of the invention, and the exclusive use of all modifications which come within the scope of the appended claims is reserved.

What is claimed is:

1. A method of imaging a human body portion of a living person via magnetic resonance of oxygen-17 comprising the steps of:
   (a) generating a static magnetic field of a selected magnitude around said living person, said selected magnitude not being substantially greater than 3 Tesla;
   (b) generating a resonant electromagnetic field of a selected frequency around said human body portion,
      the frequency of said resonant electromagnetic field and the magnitude of said static magnetic field being selected to cause magnetic resonance of oxygen-17 constituents in said human body portion, the concentration of said oxygen-17 constituents in said human body portion being smaller than about 100 times the natural abundance of oxygen-17 in said human body portion;
   (c) receiving oxygen-17 NMR signals generated from said magnetic resonance of said oxygen-17 constituents; and
   (d) generating an image of said human body portion based upon said oxygen-17 NMR signals.

2. A method of imaging as defined in claim 1 additionally comprising the step of (e) generating magnetic field gradients around said living person, said magnetic field gradients having a magnitude not substantially greater than 5 gauss per centimeter.

3. A method of imaging as defined in claim 1 additionally comprising the step of (e) generating magnetic field gradients around said living person, said magnetic field gradients having a magnitude not substantially greater than 1 gauss per centimeter.

4. A method of imaging as defined in claim 1 wherein during said step (c) an NMR signal is generated for an area of said human body portion and wherein said step (c) is repeated a plurality of times for said area to generate a plurality of sets of NMR signals for said area, said method additionally comprising the step of (e) generating a set of average NMR signals based on said plurality of NMR signals, and, therein during said step (d) an image of said area of said human body portion is generated based upon said set of average NMR signals.

5. A method of imaging as defined in claim 1 wherein said resonant electromagnetic field is generated in said step (b) by transmitting a plurality of RF pulses spaced apart by a repetition time TR, said repetition time TR being less than 34 milliseconds.

6. A method of imaging as defined in claim 1 wherein said resonant electromagnetic field is generated in said step (b) by transmitting a plurality of Hermitian pulses spaced apart by a repetition time TR, said repetition time TR being less than 34 milliseconds.

7. A method of imaging as defined in claim 1 additionally comprising the step of (e) generating magnetic field gradients by generating an plurality of pulses having an echo delay time TE, said echo delay time TE being less than nine milliseconds.

8. A method of imaging as defined in claim 1 wherein said step (c) is performed after said person has inhaled an amount of gas containing a concentration of oxygen-17 substantially different than the natural abundance of oxygen-17 in air.

9. A method of imaging as defined in claim 8 wherein said concentration of oxygen-17 in said inhaled gas is greater than the natural abundance of oxygen-17.

10. A method of imaging as defined in claim 9 wherein said concentration of oxygen-17 in said inhaled gas is at least about 10%.

11. A method of imaging as defined in claim 10 wherein said concentration of oxygen-17 in said inhaled gas is at least about 20%.

12. A method of imaging as defined in claim 1 additionally comprising the step (e) of determining the quantitative rate of oxygen consumption in an area of said human body portion based upon said oxygen-17 NMR signals received during said step (c).

13. A method of imaging as defined in claim 1 additionally comprising the step (e) of determining the quantitative rate of blood flow in an area of said human body portion based upon said oxygen-17 NMR signals received during said step (c).

14. An apparatus for generating an image of a human body portion of a living person via magnetic resonance of oxygen-17, said apparatus comprising:
  whole body means for generating a static magnetic field of a selected magnitude around said living person, said selected magnitude not being substantially greater than 3 Tesla;
  means for generating a resonant electromagnetic field of a selected frequency around said human body portion, the frequency of said resonant electromagnetic field and the magnitude of said static magnetic field being selected to cause magnetic resonance of oxygen-17 constituents in said human body portion;
  means for receiving oxygen-17 NMR signals from magnetic resonance of oxygen-17 constituents in said human body portion having a concentration smaller than 100 times the natural abundance of oxygen-17; and
  means for generating an image of said human body portion based upon said oxygen-17 NMR signals.

15. An apparatus as defined in claim 14 wherein said whole body means for generating a static magnetic field comprises a superconducting magnet.

16. An apparatus as defined in claim 14 wherein said means for generating a resonant electromagnetic field comprises an RF coil and a transmitter coupled to said RF coil.

17. An apparatus as defined in claim 14 wherein said means for generating a resonant electromagnetic field comprises head coil means for generating a resonant magnetic field about the head of said living person and a transmitter coupled to said head coil means.

18. An apparatus as defined in claim 14 additionally comprising means for generating magnetic field gradients around said living person, said magnetic field gradients having a magnitude not substantially greater than 5 gauss per centimeter.

19. An apparatus as defined in claim 14 additionally comprising means for generating magnetic field gradients around said living person, said magnetic field gradients having a magnitude not substantially greater than 1 gauss per centimeter.

20. An apparatus as defined in claim 14 wherein said NMR receiving means receives a plurality of NMR signals for an area of said human body portion, said NMR signals being received at a plurality of times for said area to generate a plurality of sets of NMR signals for said area, said apparatus additionally comprising means for generating a set of average NMR signals based on said plurality of NMR signals, said image of said area of said human body portion being generated based upon said set of average NMR signals.

21. An apparatus as defined in claim 14 wherein said means for generating a resonant electromagnetic field includes means for transmitting a plurality of RF pulses spaced apart by a repetition time TR, said repetition time TR being less than 34 milliseconds.

22. An apparatus as defined in claim 21 wherein said means for transmitting RF pulses transmits Hermitian pulses.

23. An apparatus as defined in claim 14 additionally comprising means for generating magnetic field gradients by generating an plurality of pulses having an echo delay time TE, said echo delay time TE being less than nine milliseconds.

24. An apparatus as defined in claim 14 wherein said receiving means comprises means for receiving said NMR signals during inhalation by said living person of gas containing a concentration of oxygen-17 substantially different than the natural abundance of oxygen.

25. An apparatus as defined in claim 14 wherein said receiving means comprises means for receiving said NMR signals during inhalation by said living person of gas containing a concentration of oxygen-17 greater than the natural abundance of oxygen-17.

26. An apparatus as defined in claim 14 wherein said receiving means comprises means for receiving said NMR signals during inhalation by said living person of gas containing a concentration of oxygen-17 of at least about 10%.

27. An apparatus as defined in claim 14 wherein said receiving means comprises means for receiving said NMR signals during inhalation by said living person of gas containing a concentration of oxygen-17 of at least about 20%.

28. An apparatus as defined in claim 14 additionally comprising means for determining the quantitative rate of oxygen consumption in an area of said human body portion based upon said oxygen-17 NMR signals received by said receiving means.

29. An apparatus as defined in claim 14 additionally comprising means for determining the quantitative rate of blood flow in an area of said human body portion based upon said oxygen-17 NMR signals received by said receiving means.

* * * * *

UNITED STATES PATENT AND TRADEMARK OFFICE
CERTIFICATE OF CORRECTION

PATENT NO. : 5,433,196
DATED : July 18, 1995
INVENTOR : Daniel Fiat

It is certified that error appears in the above-identified patent and that said Letters Patent is hereby corrected as shown below:

Column 2, line 33, "This is clue to" should be --This is due to--.

Column 3, lines 61-62, "referred m as" should be --referred to as--.

Column 12, line 49, "the fine 128" should be --the line 128--.

Column 15, line 11, "where CMR1702" should be --where $CMR^{17}O_2$--.

Column 16, line 12, "magnitudes of $C_b(t_i,$" should be --magnitudes of $C_b(t_i)$,--.

Column 19, line 15, "$(2e^{\alpha wt}/))Q_w...$" should be --$(2e^{\alpha wt}/((Q_w...$--.

Column 19, line 29, "step 3 12 is" should be --step 312 is--.

Signed and Sealed this

Ninth Day of January, 1996

Attest:

BRUCE LEHMAN

*Attesting Officer*     *Commissioner of Patents and Trademarks*